US010553167B2

(12) United States Patent
Mitsuzawa et al.

(10) Patent No.: US 10,553,167 B2
(45) Date of Patent: Feb. 4, 2020

(54) DISPLAY DEVICE

(71) Applicant: Japan Display Inc., Tokyo (JP)

(72) Inventors: Yutaka Mitsuzawa, Tokyo (JP); Takayuki Nakao, Tokyo (JP); Yutaka Ozawa, Tokyo (JP); Masaya Tamaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/020,055

(22) Filed: Jun. 27, 2018

(65) Prior Publication Data

US 2019/0005904 A1 Jan. 3, 2019

(30) Foreign Application Priority Data

Jun. 29, 2017 (JP) ................................. 2017-127908
Mar. 26, 2018 (JP) ................................. 2018-058374

(51) Int. Cl.
| | | |
|---|---|---|
| *G09G 3/36* | (2006.01) | |
| *G09G 5/39* | (2006.01) | |
| *H04N 5/3745* | (2011.01) | |
| *G11C 11/16* | (2006.01) | |
| *G11C 11/14* | (2006.01) | |

(52) U.S. Cl.
CPC ......... *G09G 3/3614* (2013.01); *G09G 3/3655* (2013.01); *G09G 3/3677* (2013.01); *G09G 3/3688* (2013.01); *G09G 2300/0814* (2013.01); *G09G 2300/0842* (2013.01);
(Continued)

(58) Field of Classification Search
CPC .. G09G 3/3614; G09G 3/3648; G09G 3/3655; G09G 3/3688; G09G 2300/0809; G09G 2300/0842; G09G 2300/0857; G09G 2300/0876; G11C 3/20; G11C 11/14; G11C 11/16
See application file for complete search history.

(56) References Cited

U.S. PATENT DOCUMENTS 5,940,061 A    8/1999  Sato
5,945,972 A *  8/1999  Okumura ............. G09G 3/3648
                                              345/100
(Continued)

FOREIGN PATENT DOCUMENTS

| JP | H09-093516 A | 4/1997 |
| JP | H09-093517 A | 4/1997 |
| JP | H09-212140 A | 8/1997 |

*Primary Examiner* — Michael J Eurice
(74) *Attorney, Agent, or Firm* — K&L Gates LLP

(57) ABSTRACT

A display device includes: a plurality of sub-pixels each including a memory block; a clock signal output circuit configured to output a plurality of clock signals having different frequencies; a selection circuit configured to select one of the clock signals as a selected clock signal; a plurality of memory selection line groups provided for respective rows; a memory selection circuit configured to output a memory selection signal concurrently to the memory selection line groups in synchronization with the selected clock signal, the memory selection signal being a signal for selecting one from a plurality of memories in each of the memory blocks; a common electrode to which a common potential common to the sub-pixels is supplied; and a common-electrode driving circuit configured to switch the common potential in synchronization with the reference clock signal and output the switched common potential.

12 Claims, 22 Drawing Sheets

(52) U.S. Cl.
CPC .......... *G09G 2310/08* (2013.01); *G11C 11/14* (2013.01); *G11C 11/16* (2013.01)

(56) References Cited

U.S. PATENT DOCUMENTS

| | | | | | |
|---|---|---|---|---|---|
| 5,982,398 | A * | 11/1999 | Yamamoto | ................ | G06T 1/60 345/422 |
| 6,894,671 | B2 * | 5/2005 | Yamamoto | ........... | G09G 3/2011 345/89 |
| 2001/0020941 | A1 * | 9/2001 | Reynolds | .............. | G06T 15/405 345/422 |
| 2001/0048420 | A1 * | 12/2001 | Yamamoto | ........... | G09G 3/2011 345/89 |
| 2002/0089496 | A1 * | 7/2002 | Numao | ................ | G09G 3/3258 345/204 |
| 2002/0093472 | A1 * | 7/2002 | Numao | ................ | G09G 3/3258 345/87 |
| 2002/0113783 | A1 * | 8/2002 | Tamura | ................. | G11C 7/065 345/213 |
| 2003/0016202 | A1 * | 1/2003 | Edwards | ............. | G09G 3/2011 345/98 |
| 2003/0107535 | A1 * | 6/2003 | Numao | ................ | G09G 3/3258 345/76 |
| 2003/0142056 | A1 * | 7/2003 | Okamoto | ............ | G09G 3/2007 345/90 |
| 2004/0196235 | A1 * | 10/2004 | Koyama | ............. | G09G 3/3607 345/89 |
| 2005/0012033 | A1 * | 1/2005 | Stern | ..................... | G01T 1/2928 250/214 R |
| 2005/0116261 | A1 * | 6/2005 | Van Der Zaag | ......... | G09G 3/20 257/232 |
| 2005/0157539 | A1 * | 7/2005 | Van Der Zaag | ........ | G11C 11/16 365/158 |
| 2005/0230723 | A1 * | 10/2005 | Van Der Zaag | ......... | G09G 3/20 257/295 |
| 2008/0174613 | A1 * | 7/2008 | Kawabe | ............... | G09G 3/3266 345/690 |
| 2008/0191968 | A1 * | 8/2008 | Kawabe | ............... | G09G 3/2022 345/55 |
| 2009/0002535 | A1 * | 1/2009 | Park | ..................... | H04N 3/1568 348/308 |
| 2010/0295841 | A1 * | 11/2010 | Matsuda | .............. | G09G 3/3674 345/213 |
| 2010/0309173 | A1 * | 12/2010 | Matsuda | .............. | G09G 3/3674 345/204 |
| 2012/0099038 | A1 * | 4/2012 | Yoshiga | ............ | G02F 1/133371 349/33 |
| 2013/0002626 | A1 * | 1/2013 | Washio | ................ | G09G 3/2085 345/205 |
| 2014/0340383 | A1 * | 11/2014 | Gyouten | .............. | G09G 3/3696 345/212 |
| 2016/0203767 | A1 * | 7/2016 | Yamazaki | ............ | G09G 3/2007 345/211 |
| 2016/0372054 | A1 * | 12/2016 | Yamazaki | .............. | G09G 3/344 |
| 2017/0187976 | A1 * | 6/2017 | Cok | ...................... | H04N 5/376 |
| 2018/0191978 | A1 * | 7/2018 | Cok | ...................... | G09G 3/3208 |
| 2018/0211615 | A1 * | 7/2018 | Tan | ..................... | G02F 1/13306 |

* cited by examiner

DISPLAY DEVICE

CROSS-REFERENCE TO RELATED APPLICATIONS

This application claims priority from Japanese Application No. 2017-127908, filed on Jun. 29, 2017 and Japanese Application No. 2018-058374, filed on Mar. 26, 2018, the contents of which are incorporated by reference herein in its entirety.

BACKGROUND

1. Technical Field

The present invention relates to a display device.

2. Description of the Related Art

A display device, which displays images, includes a plurality of pixels. Japanese Patent Application Laid-open Publication No. 09-212140 (JP-A-09-212140) discloses what is called a memory-in-pixel (MIP) type display device in which each pixel includes a memory. In the display device disclosed in JP-A-09-212140, each of the pixels includes a plurality of memories and a circuit that switches the memories from one to another.

In a display device, pixels display an image (a frame) in accordance with voltages between pixel electrodes and a common electrode. In some cases, a display device employs, to prevent screen burn-in, a common inversion driving method in which the potential of the common electrode thereof is inverted. It is desirable for it to cause the frequency at which frames are switched and the frequency at which the polarity of the common electrode is inverted to be different from each other in accordance with the manner in which the display device is used.

For the foregoing reasons, there is a need for a display device capable of causing the frequency at which frames are switched and the frequency at which the potential of the common electrode is inverted to be different from each other.

SUMMARY

According to an aspect, a display device includes: a plurality of sub-pixels arranged in a row direction and a column direction and each including a memory block that includes a plurality of memories each of which is configured to store therein sub-pixel data; a clock signal output circuit configured to, based on a reference clock signal, output a plurality of clock signals having different frequencies; a selection circuit configured to select one of the clock signals as a selected clock signal; a plurality of memory selection line groups provided for respective rows and each including a plurality of memory selection lines electrically coupled to the memory blocks in the respective sub-pixels that belong to the corresponding row; a memory selection circuit configured to output a memory selection signal concurrently to the memory selection line groups in synchronization with the selected clock signal, the memory selection signal being a signal for selecting one from the memories in each of the memory blocks; a common electrode to which a common potential common to the sub-pixels is supplied; and a common-electrode driving circuit configured to switch the common potential in synchronization with the reference clock signal and output the switched common potential. Each of the sub-pixels is configured to select one of the memories of the memory block and display an image based on the sub-pixel data stored in the selected one of the memories, the selected one corresponding to the memory selection line that has been supplied with the memory selection signal.

According to another aspect, a display device includes: a plurality of sub-pixels arranged in a row direction and a column direction and each including a memory block that includes a plurality of memories each of which is configured to store therein sub-pixel data; a clock signal output circuit configured to, based on a reference clock signal, output a plurality of clock signals having different frequencies; a selection circuit configured to select one of the clock signals as a first selected clock signal and select one of the clock signals as a second selected clock signal; a plurality of memory selection line groups provided for respective rows and each including a plurality of memory selection lines electrically coupled to the memory blocks in the respective sub-pixels that belong to the corresponding row; a memory selection circuit configured to output a memory selection signal concurrently to the memory selection line groups in synchronization with the first selected clock signal, the memory selection signal being a signal for selecting one from the memories in each of the memory blocks; a common electrode to which a common potential common to the sub-pixels is supplied; and a common-electrode driving circuit configured to switch the common potential in synchronization with the second selected clock signal and output the switched common potential. Each of the sub-pixels configured to select one of the memories of the memory block and display an image based on the sub-pixel data stored in the selected one of the memories, the selected one corresponding to the memory selection line that has been supplied with the memory selection signal.

DETAILED DESCRIPTION

Figure 1:
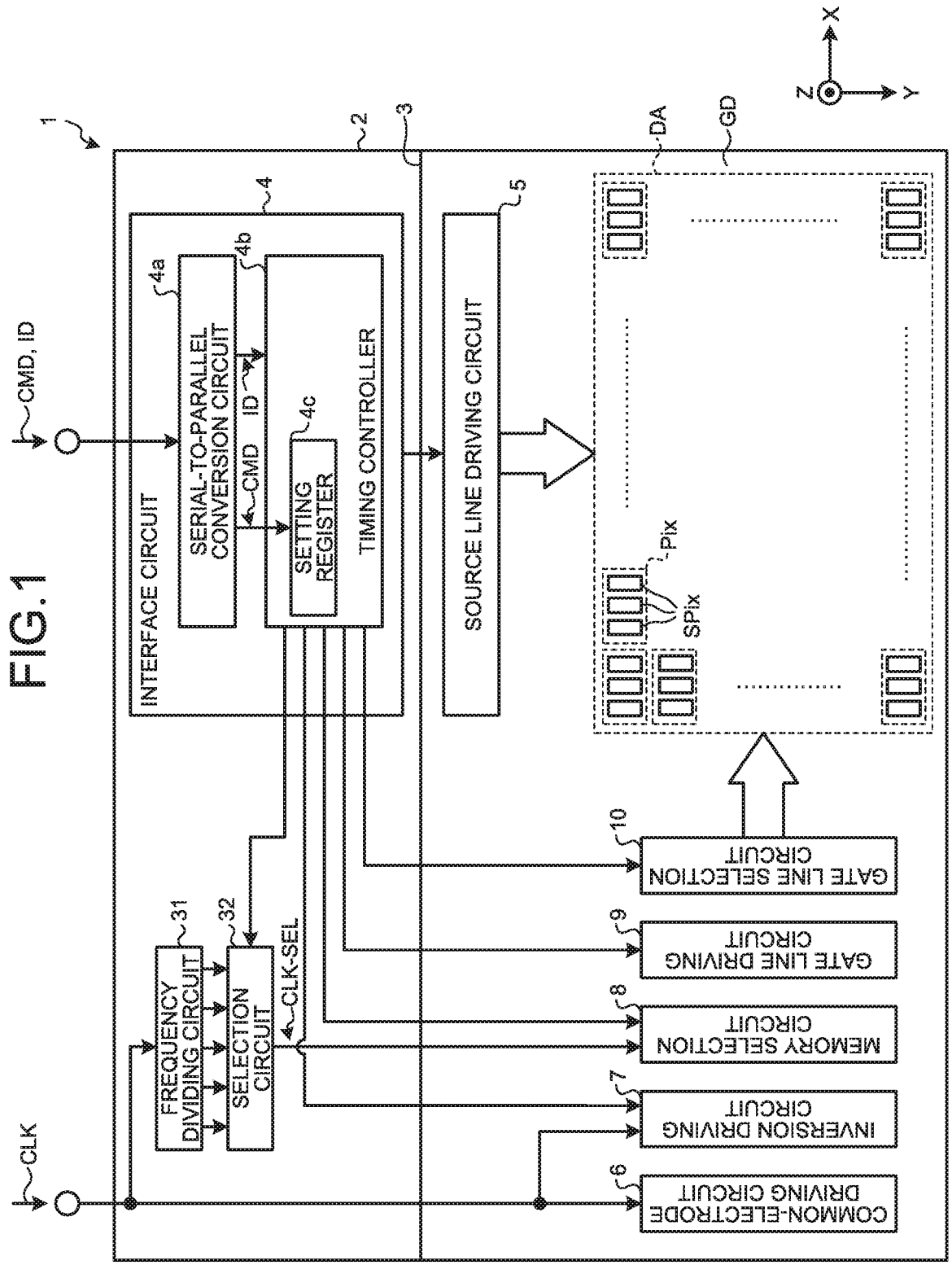
FIG. 1 schematically illustrates an entire configuration of a display device in a first embodiment.

Modes (embodiments) for carrying out the present invention are described hereinbelow in detail with reference to the drawings. What is disclosed herein is not limited by the descriptions of the following embodiments. The constituent elements described below include those readily apparent to the skilled person or substantially the same. Any two or more of the constituent elements described below can be combined as appropriate. The disclosure is merely exemplary, and modifications made without departing from the spirit of the invention and readily apparent to the skilled person naturally fall within the scope of the present disclosure. The widths, the thicknesses, the shapes, or the like of certain devices in the drawings may be illustrated not-to-scale, for illustrative clarity. However, the drawings are merely exemplary and not intended to limit interpretation of the present disclosure. Throughout the description and the drawings, the same elements as those already described with reference to the drawing already referred to are assigned the same reference signs, and detailed descriptions thereof are omitted as appropriate.

In this disclosure, when an element is described as being "on" another element, the element can be directly on the other element, or there can be one or more elements between the element and the other element.

1. First Embodiment 1-1. Entire Configuration

FIG. 1 schematically illustrates an entire configuration of a display device 1 in a first embodiment. The display device 1 includes a first panel 2 and a second panel 3 disposed facing the first panel 2. The display device 1 has a display region DA on which images are displayed, and a frame region GD outside of the display region DA. In the display region DA, a liquid crystal layer is sealed between the first panel 2 and the second panel 3.

While the display device 1 is described in the first embodiment as a liquid crystal display device including a liquid crystal layer, the present disclosure is not limited to this example. The display device 1 may be an organic electro-luminescence (EL) display device including organic EL elements in place of a liquid crystal layer.

In the display region DA, a plurality of pixels Pix are disposed in a matrix of N columns (where N is a natural number) and M rows (where M is a natural number). The N columns are arranged in the X direction parallel to the respective principal planes of the first panel 2 and the second panel 3, and the M rows are arranged in the Y direction, which is parallel to the respective principal planes of the first panel 2 and the second panel 3 and intersects the X direction.

In the frame region GD, an interface circuit 4, a source line driving circuit 5, a common-electrode driving circuit 6, an inversion driving circuit 7, a memory selection circuit 8, a gate line driving circuit 9, a gate line selection circuit 10, a frequency dividing circuit 31, and a selection circuit 32 are disposed. Another configuration can be employed in which, while the interface circuit 4, the source line driving circuit 5, the common-electrode driving circuit 6, the inversion driving circuit 7, the memory selection circuit 8, the frequency dividing circuit 31, and the selection circuit 32 of the foregoing circuits are integrated into an integrated circuit (IC) chip, the gate line driving circuit 9 and the gate line selection circuit 10 are provided on the first panel 2.

Still another configuration can be employed in which a group of such circuits integrated into an IC chip is provided in a processor external to the display device 1 and is coupled to the display device 1.

Each of the M×N pixels Pix has a plurality of sub-pixels SPix. While these sub-pixels SPix are described in the first embodiment as three pixels of R (red), G (green), and B (blue), the present disclosure is not limited to this example. These sub-pixels SPix may be four sub-pixels of colors including W (white) in addition to R (red), G (green), and B (blue). Alternatively, these sub-pixels SPix may be five or more sub-pixels of different colors.

In the first embodiment, each pixel Pix includes three sub-pixels SPix, and the total number of sub-pixels SPix disposed in the display region DA is accordingly M×N×3. In the first embodiment, three sub-pixels SPix in each of the M×N pixels Pix are arranged in the X direction, and the total number of sub-pixels SPix disposed in any one of the rows included in the M×N pixels Pix is accordingly N×3.

Each of the sub-pixels SPix includes a plurality of memories. While these memories are described in the first embodiment as three memories that are a first memory to a third memory, the present disclosure is not limited to this example. These memories may be two memories or may be four or more memories.

In the first embodiment, each sub-pixel SPix includes three memories, and the total number of memories disposed in the display region DA is accordingly M×N×3×3. In the first embodiment, each of the sub-pixels SPix includes three memories, and the total number of memories disposed in any one of the rows included in the M×N pixels Pix is accordingly N×3×3.

Each of the sub-pixels SPix performs display based on sub-pixel data stored in one memory selected from the first to third memories included in the sub-pixel SPix. That is, a set of M×N×3×3 memories included in the M×N×3 sub-pixels SPix is equivalent to three frame memories.

The interface circuit 4 includes a serial-to-parallel conversion circuit 4a and a timing controller 4b. The timing controller 4b includes a setting register 4c. The serial-to-parallel conversion circuit 4a is supplied with command data CMD and image data ID in the form of serial data from an external circuit. While the external circuit is exemplified by a host central processing unit (CPU) or an application processor, the present disclosure is not limited to these examples.

The serial-to-parallel conversion circuit 4a converts the command data CMD supplied thereto into parallel data and outputs the parallel data to the setting register 4c. The setting register 4c has values therein set based on the command data CMD. The values are used for controlling the source line driving circuit 5, the inversion driving circuit 7, the memory selection circuit 8, the gate line driving circuit 9, the gate line selection circuit 10, and the selection circuit 32.

The serial-to-parallel conversion circuit 4a converts the image data ID supplied thereto into parallel data and outputs the parallel data to the timing controller 4b. Based on the values that are set in the setting register 4c, the timing controller 4b outputs the image data ID to the source line driving circuit 5. Based on the values that are set in the setting register 4c, the timing controller 4b controls the inversion driving circuit 7, the memory selection circuit 8, the gate line driving circuit 9, the gate line selection circuit 10, and the selection circuit 32.

The common-electrode driving circuit 6, the inversion driving circuit 7, and the frequency dividing circuit 31 are supplied with a reference clock signal CLK from an external circuit. While the external circuit is exemplified by a clock generator, the present disclosure is not limited to this example.

Based on the reference clock signal CLK, the frequency dividing circuit 31 outputs a plurality of clock signals that have different frequencies to the selection circuit 32. More specifically, the frequency dividing circuit 31 outputs, to the selection circuit 32, a plurality of frequency-divided clock signals obtained by dividing the frequency of the reference clock signal CLK by a plurality of frequency division factors.

Under the control of a timing controller 4b, the selection circuit 32 selects one of the frequency-divided clock signals as a selected clock signal CLK-SEL. The selection circuit 32 outputs the selected clock signal CLK-SEL to the memory selection circuit 8.

In the first embodiment, the display device 1 employs a common inversion driving method. In the display device 1 that employs a common inversion driving method, the common-electrode driving circuit 6 inverts the potential (common potential) of a common electrode in synchronization with the reference clock signal CLK. The common-electrode driving circuit 6 may switch the common potential between a high potential and a low potential. Under the control of the timing controller 4b, the inversion driving circuit 7 inverts the potentials of sub-pixel electrodes in synchronization with the reference clock signal CLK. Thus, the display device 1 can implement a common inversion driving method. In the first embodiment, the display device 1 is a normally-black liquid crystal display device that displays black when no voltage is applied to the liquid crystal and displays white when a certain voltage is applied to the liquid crystal. A normally-black liquid crystal display device displays black when the potential of the sub-pixel electrode and the common potential are in phase with each other, and displays white when the potential of the sub-pixel electrode and the common potential are out of phase with each other. This example, however, is not limiting. A normally-white configuration can be alternatively employed in which: white is displayed when the potential of the sub-pixel electrode and the common potential are in phase with each other; and black is displayed when the potential of the sub-pixel electrode and the common potential are not in phase with each other.

In order to display an image on the display device 1, it is necessary to have the sub-pixel data stored in the first to the third memories in each of the sub-pixels SPix. Under the control of the timing controller 4b, the gate line driving circuit 9 outputs a gate signal for selecting one of the rows included in the M×N pixels Pix so that the sub-pixel data can be stored in these individual memories.

In an MIP-type liquid crystal display device in which each sub-pixel includes one memory, one gate line is disposed for each row (pixel row (sub-pixel row)). In the embodiment, however, each of the sub-pixels SPix includes three memories that are the first memory to the third memory. For this reason, three gate lines are disposed for each row in the embodiment.

The respective three gate lines are electrically coupled to the first memory to the third memory in each of the sub-pixels SPix included in the one row. In a configuration such that each of the sub-pixels SPix is configured to operate in accordance with a gate signal and an inverted gate signal obtained by inverting the gate signal, six gate lines are disposed for each row.

The three or six gate lines disposed for each row correspond to a gate line group. In the first embodiment, the display device 1 includes M rows of pixels Pix, and M gate line groups are accordingly disposed.

The gate line driving circuit 9 includes M output terminals corresponding to the M rows of pixels Pix. Under the control of the timing controller 4b, the gate line driving circuit 9 sequentially outputs, from the M output terminals, the gate signal serving as a signal for selecting one of the M rows.

Under the control of the timing controller 4b, the gate line selection circuit 10 selects one of the three gate lines disposed for each row. Thus, the gate signal output from the gate line driving circuit 9 is supplied to the selected one of the three gate lines disposed with respect to the one row.

Under the control of the timing controller 4b, the source line driving circuit 5 outputs the sub-pixel data to memories selected in accordance with the gate signal. Thus, the corresponding sub-pixel data is sequentially stored in the first memory to the third memory in each of the sub-pixels SPix.

The display device 1 performs line sequential scanning on the M rows of pixels Pix to store the sub-pixel data, as frame data for one frame, in the first memories in the sub-pixels SPix. The display device 1 performs the line sequential scanning three times to store the frame data for three frames in the first memory to the third memory in each of the sub-pixels SPix.

For the same effect, the display device 1 can alternatively employs another procedure in which corresponding data are written into the first memories, into the second memories, and into the third memories when each of the rows is scanned. When this scanning is performed on the individual first to M-th rows, the sub-pixel data in the first memories to the third memories in the respective sub-pixels SPix can be stored through line sequential scanning performed only one time.

In the first embodiment, three memory selection lines are disposed for each row. The three memory selection lines are electrically coupled to the first to the third memories, respectively, in each of N×3 sub-pixels SPix included in the one row. In a configuration such that each of the sub-pixels SPix is configured to operate in accordance with a memory selection signal and an inverted memory selection signal obtained by inverting the memory selection signal, six memory selection lines are disposed for each row.

The three or six memory selection lines disposed for each row correspond to a memory selection line group. In the first embodiment, the display device 1 includes the pixels Pix disposed in the M rows, and M memory selection line groups are accordingly disposed.

Under the control of the timing controller 4b, the memory selection circuit 8 concurrently selects the first memories, the second memories, or the third memories in the respective sub-pixels SPix in synchronization with the selected clock signal CLK-SEL. More specifically, the first memories in all of the sub-pixels SPix are concurrently selected. Otherwise, the second memories in all of the sub-pixels SPix are concurrently selected. Otherwise, the third memories in all of the sub-pixels SPix are concurrently selected. Consequently, the display device 1 can display one among three images by switching selection of a memory from one to another among the first memory to the third memory in each of the sub-pixels SPix. Thus, the display device 1 can change images all together and can quickly change images. The display device 1 enables animation display (moving image display) by sequentially switching selection of a memory from one to another among the first memory to the third memory in each of the sub-pixels SPix.

1-2. Sectional Structure

Figure 2:
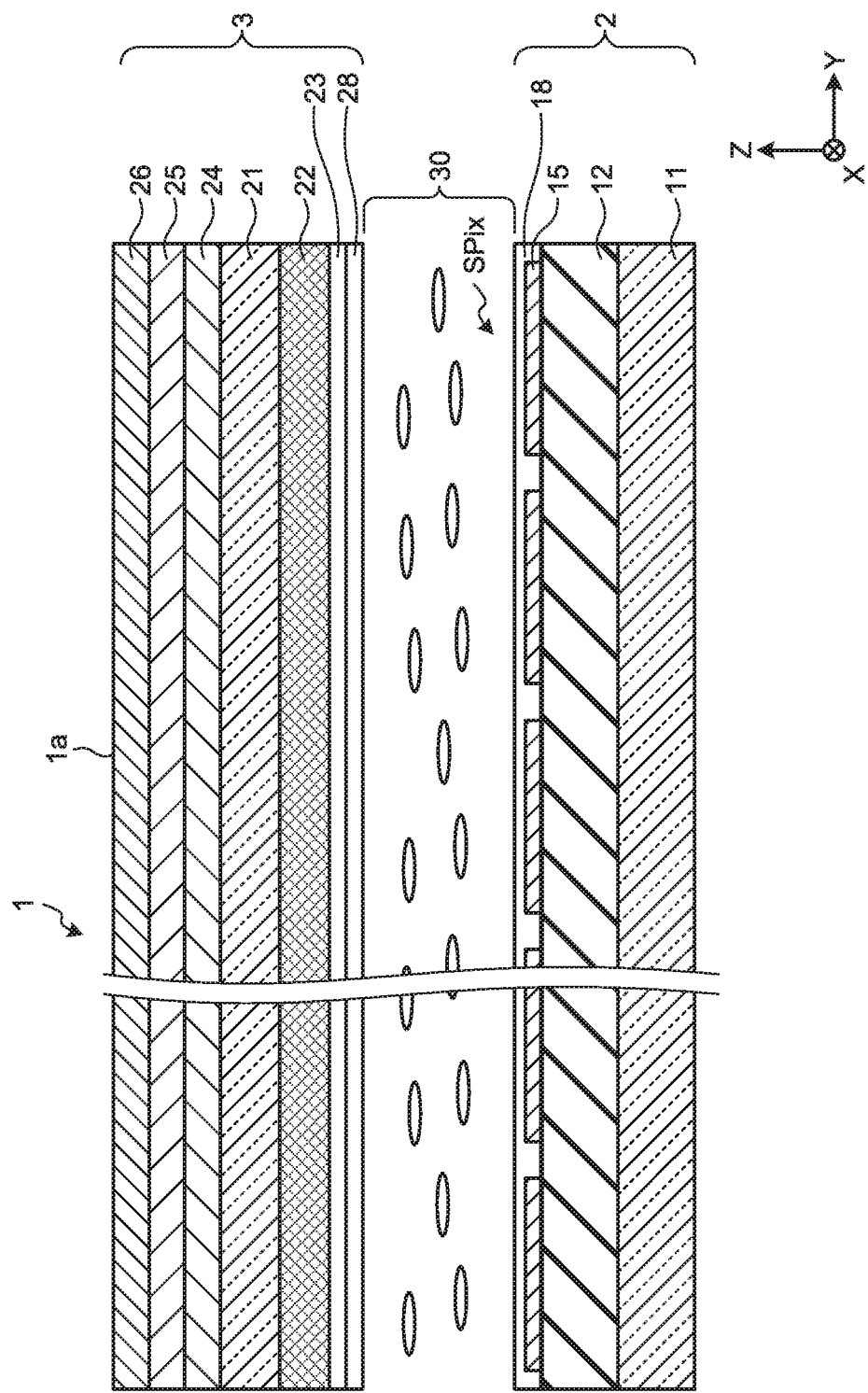
FIG. 2 is a sectional diagram of the display device in the first embodiment.

FIG. 2 is a sectional diagram of the display device 1 in the first embodiment. As illustrated in FIG. 2, the display device 1 includes the first panel 2, the second panel 3, and a liquid crystal layer 30. The second panel 3 is disposed facing the first panel 2. The liquid crystal layer 30 is interposed between the first panel 2 and the second panel 3. One surface of the second panel 3 that constitutes the principal plane thereof is a display surface 1a for having an image displayed thereon.

Light incident on the display surface 1a from the outside thereof is reflected by reflective electrodes 15 in the first panel 2 and exits from the display surface 1a. The display device 1 is a reflective liquid crystal display device that displays an image on the display surface 1a using this reflected light. In the present description, one direction parallel to the display surface 1a is set as the X direction, and a direction extending on a plane parallel to the display surface 1a and intersecting the X direction is set as the Y direction. A direction perpendicular to the display surface 1a is set as the Z direction.

The first panel 2 includes a first substrate 11, an insulating layer 12, the reflective electrodes 15, and an orientation film 18. The first substrate 11 is exemplified by a glass substrate or a resin substrate. On a surface of the first substrate 11, circuit elements and wiring of various kinds such as gate lines and data lines are mounted, which are not illustrated. Switching elements such as thin film transistors (TFTs) and capacitive elements are included in the circuit elements.

The insulating layer 12 is disposed on the first substrate 11, and serves to provide a flush surface all over the surfaces of the circuit elements and the wiring of various kinds. The reflective electrodes 15 are disposed on the insulating layers 12. The orientation film 18 is interposed between the reflective electrodes 15 and the liquid crystal layer 30. The reflective electrodes 15 each having a rectangular shape are provided corresponding to the sub-pixels SPix. The reflective electrodes 15 are formed of metal exemplified by aluminum (Al) or silver (Ag). The reflective electrodes 15 may have a configuration stacked with such a metal material and a translucent conductive material exemplified by indium tin oxide (ITO). The reflective electrodes 15 are formed of a material having favorable reflectance, thereby functioning as a reflective plate that reflects light incident from the outside.

After being reflected by the reflective electrodes 15, the light travels in a uniform direction toward the display surface 1a although being diffusely reflected and scattered. Change in level of voltage applied to each of the reflective electrodes 15 causes change in the state of light transmission through the liquid crystal layer 30 on that reflective electrode, that is, the state of light transmission of the corresponding sub-pixel. In other words, the respective reflective electrodes 15 also function as sub-pixel electrodes.

The second panel 3 includes a second substrate 21, a color filter 22, a common electrode 23, an orientation film 28, a quarter wavelength plate 24, a half wavelength plate 25, and a polarization plate 26. The color filter 22 and the common electrode 23 are disposed in this order on one of the two opposite surfaces of the second substrate 21, the one surface facing the first panel 2. The orientation film 28 is interposed between the common electrode 23 and the liquid crystal layer 30. The quarter wavelength plate 24, the half wavelength plate 25, and the polarization plate 26 are stacked in this order on a surface of the second substrate 21, the surface facing the display surface 1a.

The second substrate 21 is exemplified by a glass substrate or a resin substrate. The common electrode 23 is formed of a translucent conductive material exemplified by ITO. The common electrode 23 is disposed facing the reflective electrodes 15 and supplies a common potential to the sub-pixels SPix. While the color filter 22 is exemplified by one including filters for three colors of R (red), G (green), and B (blue), the present disclosure is not limited to this example.

The liquid crystal layer 30 is exemplified by one containing nematic liquid crystal. In the liquid crystal layer 30, the state of orientation of liquid crystal molecules is changed when the voltage level between the common electrode 23 and each of the reflective electrodes 15 is changed. Light transmitted through the liquid crystal layer 30 is thus modulated on a sub-pixel SPix basis.

Ambient light or the like serves as incident light that is incident on the display surface 1a of the display device 1, and reaches the reflective electrodes 15 after being transmitted through the second panel 3 and the liquid crystal layer 30. The incident light is reflected by the reflective electrodes 15 for the respective sub-pixels SPix. The light thus reflected is modulated on a sub-pixel SPix basis and exits from the display surface 1a. An image is thereby displayed.

1-3. Circuit Configuration

Figure 3:
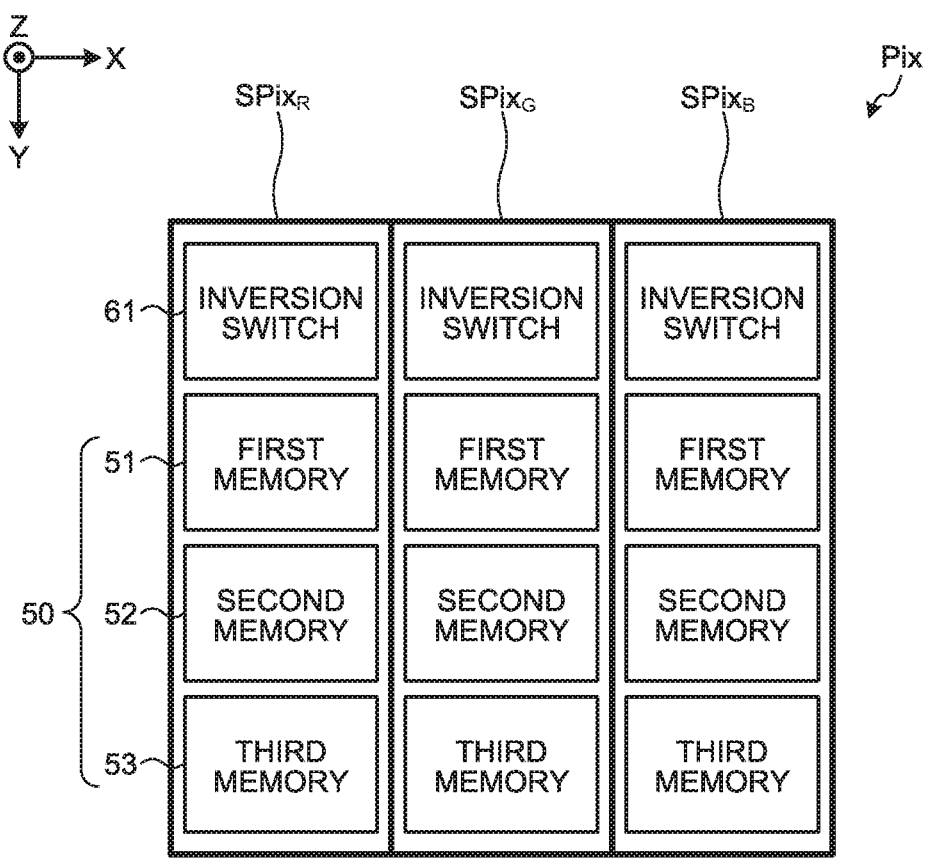
FIG. 3 illustrates an arrangement of sub-pixels in a pixel of the display device in the first embodiment.

FIG. 3 illustrates an arrangement of the sub-pixels Spix in the pixel Pix of the display device 1 in the first embodiment. The pixel Pix includes the sub-pixel $SPix_R$ for R (red), the sub-pixel $SPix_G$ for G (green), and the sub-pixel $SPix_B$ for B (blue). The sub-pixels $SPix_R$, $SPix_G$, and $SPix_B$ are arranged in the X direction.

Each of the sub-pixels $SPix_R$, $SPix_G$, and $SPix_B$ includes a memory block 50 and an inversion switch 61. The memory block 50 includes a first memory 51, a second memory 52, and a third memory 53. The inversion switch 61, the first memory 51, the second memory 52, and the third memory 53 are arranged in the Y direction.

While the first memory 51, the second memory 52, and the third memory 53 are each described herein as a memory cell that stores therein one-bit data, the present disclosure is not limited to this example. Each of the first memory 51, the second memory 52, and the third memory 53 may be a memory cell that stores therein data of two or more bits.

The inversion switch 61 is electrically coupled to between the sub-pixel electrode (reflective electrode) 15 (see FIG. 2) and the first, second, and third memories 51, 52, and 53. Based on display signals that are supplied from the inversion driving circuit 7, the inversion switch 61 inverts the sub-pixel data output from a selected one of the first memory 51, the second memory 52, and the third memory 53 with a certain period, and outputs the inverted sub-pixel data to the sub-pixel electrode 15, the display signals including: a signal that varies in synchronization and in phase with the reference clock signal CLK; and another signal that varies in synchronization and in opposite phase with the reference clock signal CLK. The display signal inverts with the same period as the potential (common potential) of the common electrode 23 switches.

The inversion switch 61 is an example of a switch circuit.

Figure 4:
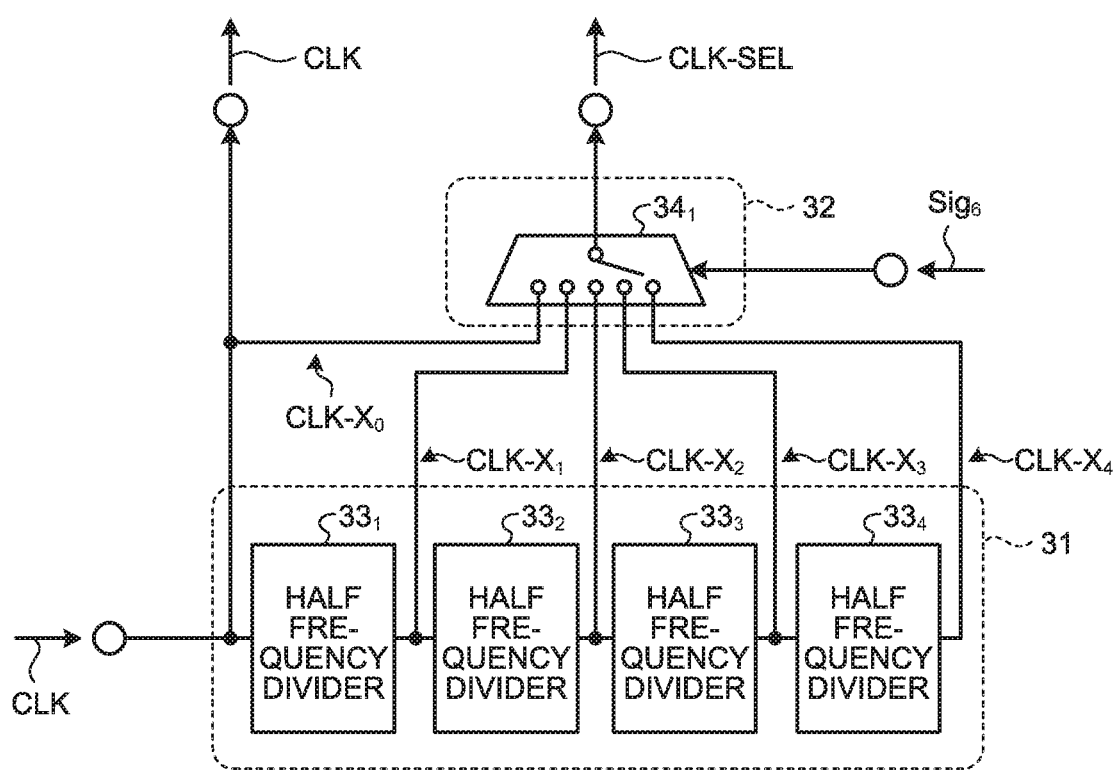
FIG. 4 illustrates circuit configurations of a frequency dividing circuit and a selection circuit of the display device in the first embodiment.

FIG. 4 illustrates circuit configurations of a frequency dividing circuit and a selection circuit of the display device 1 in the first embodiment.

The frequency dividing circuit 31 includes a first half frequency divider $33_1$ to a fourth half frequency divider $33_4$ that are coupled in a daisy chain fashion. Each of the first half frequency divider $33_1$ to the fourth half frequency divider $33_4$ can be made up of a flip-flop.

A first frequency-divided clock signal CLK-$X_0$, which is the reference clock signal CLK, is supplied to the first half frequency divider $33_1$. The first frequency-divided clock signal CLK-$X_0$ can be considered as a signal obtained by dividing the frequency of the reference clock signal CLK by 1.

The first half frequency divider $33_1$ outputs, to the second half frequency divider $33_2$ and the selection circuit 32, a second frequency-divided clock signal CLK-$X_1$ obtained by dividing the frequency of the first frequency-divided clock signal CLK-$X_0$ by 2. The second half frequency divider $33_2$ outputs, to the third half frequency divider $33_3$ and the selection circuit 32, a third frequency-divided clock signal CLK-$X_2$ obtained by dividing the frequency of the second frequency-divided clock signal CLK-$X_1$ by 2.

The third half frequency divider $33_3$ outputs, to the fourth half frequency divider $33_4$ and the selection circuit 32, a fourth frequency-divided clock signal CLK-$X_3$ obtained by dividing the frequency of the third frequency-divided clock signal CLK-$X_2$ by 2. The fourth half frequency divider $33_4$ outputs, to the selection circuit 32, a fifth frequency-divided clock signal CLK-$X_4$ obtained by dividing the frequency of the fourth frequency-divided clock signal CLK-$X_3$ by 2.

The frequency dividing circuit 31 is an example of a clock signal output circuit.

The selection circuit 32 includes a selector $34_1$. The selector $34_1$ is supplied with the first frequency-divided clock signal CLK-$X_0$ to the fifth frequency-divided clock signal CLK-$X_4$. Based on a control signal $Sig_6$ supplied from the timing controller 4b, the selector $34_1$ selects one frequency-divided clock signal out of the first frequency-divided clock signal CLK-$X_0$ to the fifth frequency-divided clock signal CLK-$X_4$ as the selected clock signal CLK-SEL. The selector $34_1$ outputs the selected clock signal CLK-SEL to the memory selection circuit 8.

While the frequency dividing circuit 31 is described in the first embodiment as including the half frequency dividers 33, the present disclosure is not limited to this example. The frequency dividing circuit 31 may include a one-third frequency divider and/or a quarter frequency divider. While the frequency dividing circuit 31 is described in the first embodiment as including the four half frequency dividers 33, the present disclosure is not limited to this example. The frequency dividing circuit 31 may include three or less, or five or more, frequency dividers and output three or less, or five or more, frequency-divided clock signals to the selection circuit 32. While the frequency dividing circuit 31 is described in the first embodiment as including the first half frequency divider $33_1$ to the fourth half frequency divider $33_4$ coupled together in a daisy chain fashion, the present disclosure is not limited to this example. Production of a plurality of frequency-divided clock signals can be implemented by various circuit configurations.

While the display device 1 is described in the first embodiment as including the frequency dividing circuit 31 as a clock signal output circuit, the present disclosure is not limited to this example. The display device 1 may include a multiplying circuit in place of the frequency dividing circuit 31. The multiplying circuit may outputs, to the selection circuit 32, a plurality of multiplied clock signals obtained by multiplying the frequency of the reference clock signal CLK by a plurality of multiplication factors. In such a case, the multiplying circuit is an example of a clock signal output circuit.

Figure 5:
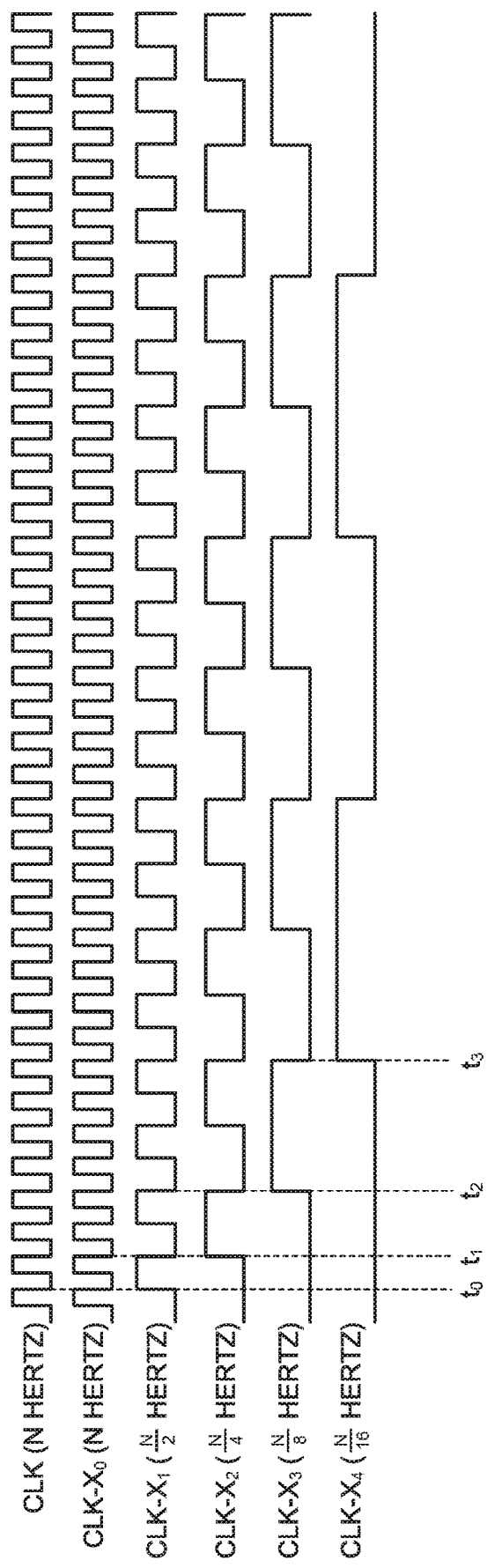
FIG. 5 illustrates waveforms of frequency-divided clock signals for the display device in the first embodiment.

FIG. 5 illustrates waveforms of the frequency-divided clock signals for the display device in the first embodiment.

The frequency of the reference clock signal CLK is denoted as N Hz (N is a positive number). The frequency of the first frequency-divided clock signal CLK-$X_0$ is N Hz, which equals the frequency of the reference clock signal CLK.

The first half frequency divider $33_1$ outputs the second frequency-divided clock signal CLK-$X_1$ obtained by dividing the frequency of the first frequency-divided clock signal CLK-$X_0$ by 2. The frequency of the second frequency-divided clock signal CLK-$X_1$ is N/2 Hz, which is half of the frequency of the first frequency-divided clock signal CLK-$X_0$. The second frequency-divided clock signal CLK-$X_1$ rises at a timing $t_0$, which corresponds to a falling edge of the first frequency-divided clock signal CLK-$X_0$. While the second frequency-divided clock signal CLK-$X_1$ is described in the first embodiment as rising at a timing that corresponds to the falling edge of the first frequency-divided clock signal CLK-$X_0$, the present disclosure is not limited to this example. The second frequency-divided clock signal CLK-$X_1$ may rise on a rising edge of the first frequency-divided clock signal CLK-$X_0$. In addition to the second frequency-divided clock signal CLK-$X_1$, the same is applied to the third frequency-divided clock signal CLK-$X_2$, the fourth frequency-divided clock signal CLK-$X_3$, and the fifth frequency-divided clock signal CLK-$X_4$, which are described below.

The second half frequency divider $33_2$ outputs the third frequency-divided clock signal CLK-$X_2$ obtained by dividing the frequency of the second frequency-divided clock signal CLK-$X_1$ by 2. The frequency of the third frequency-divided clock signal CLK-$X_2$ is N/4 Hz, which is half of the frequency of the second frequency-divided clock signal CLK-$X_1$. The third frequency-divided clock signal CLK-$X_2$ rises at a timing $t_1$, which corresponds to a falling edge of the second frequency-divided clock signal CLK-$X_1$.

The third half frequency divider $33_3$ outputs the fourth frequency-divided clock signal CLK-$X_3$ obtained by dividing the frequency of the third frequency-divided clock signal CLK-$X_2$ by 2. The frequency of the fourth frequency-divided clock signal CLK-$X_3$ is N/8 Hz, which is half of the frequency of the third frequency-divided clock signal CLK-$X_2$. The fourth frequency-divided clock signal CLK-$X_3$ rises at a timing $t_2$, which corresponds to a falling edge of the third frequency-divided clock signal CLK-$X_2$.

The fourth half frequency divider $33_4$ outputs the fifth frequency-divided clock signal CLK-$X_4$ obtained by dividing the frequency of the fourth frequency-divided clock signal CLK-$X_3$ by 2. The frequency of the fifth frequency-divided clock signal CLK-$X_4$ is N/16 Hz, which is half of the frequency of the fourth frequency-divided clock signal CLK-$X_3$. The fifth frequency-divided clock signal CLK-$X_4$ rises at a timing $t_3$, which corresponds to a falling edge of the fourth frequency-divided clock signal CLK-$X_3$.

Figure 6:
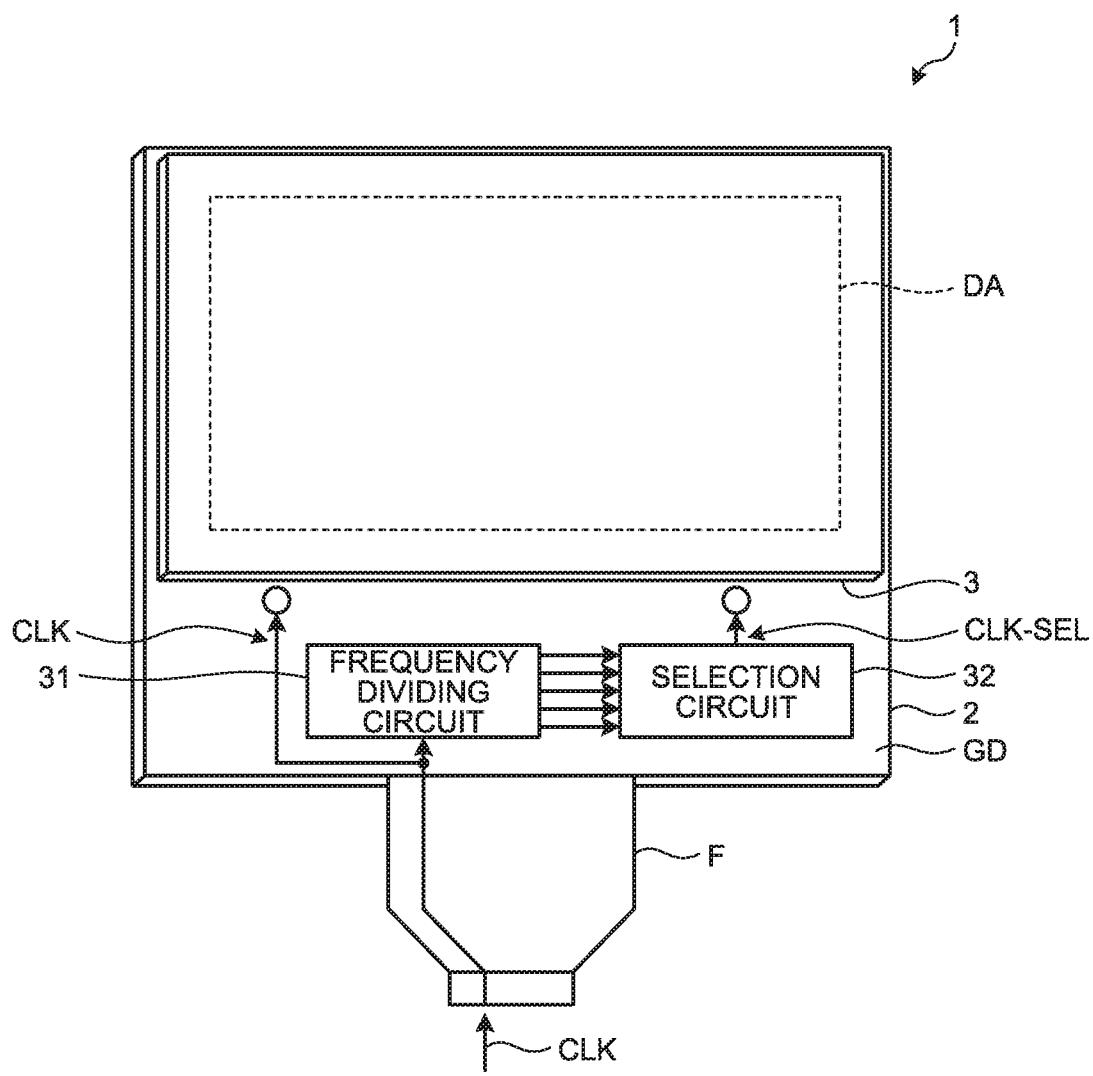
FIG. 6 illustrates a module configuration of the display device in the first embodiment.

FIG. 6 illustrates a module configuration of the display device in the first embodiment. More specifically, FIG. 6 illustrates an arrangement of the frequency dividing circuit 31 and the selection circuit 32 in the display device 1. The frequency dividing circuit 31 and the selection circuit 32 are arranged in regions within a frame region GD and where the first panel 2 is not overlapped with the second panel 3. The first panel 2 has a flexible board F attached thereto. The reference clock signal CLK is supplied to the frequency dividing circuit 31 via the flexible board F. The reference clock signal CLK is supplied also to the common-electrode driving circuit 6 (see FIG. 1) and the inversion driving circuit 7 (see FIG. 1).

The frequency dividing circuit 31 outputs, to the selection circuit 32, the first frequency-divided clock signal CLK-$X_0$ to the fifth frequency-divided clock signal CLK-$X_4$ obtained by performing frequency division on the frequency of the reference clock signal CLK. The selection circuit 32 selects one of the first frequency-divided clock signal CLK-$X_0$ to the fifth frequency-divided clock signal CLK-$X_4$ as the selected clock signal CLK-SEL. The selection circuit 32 outputs the selected clock signal CLK-SEL to the memory selection circuit 8 (see FIG. 1).

The frequency dividing circuit 31 and the selection circuit 32 may be implemented in the form of a chip on glass (COG) on the first panel 2. Alternatively, the frequency dividing circuit 31 and the selection circuit 32 may be implemented in the form of a chip on film (COF) on the flexible board F.

Figure 7:
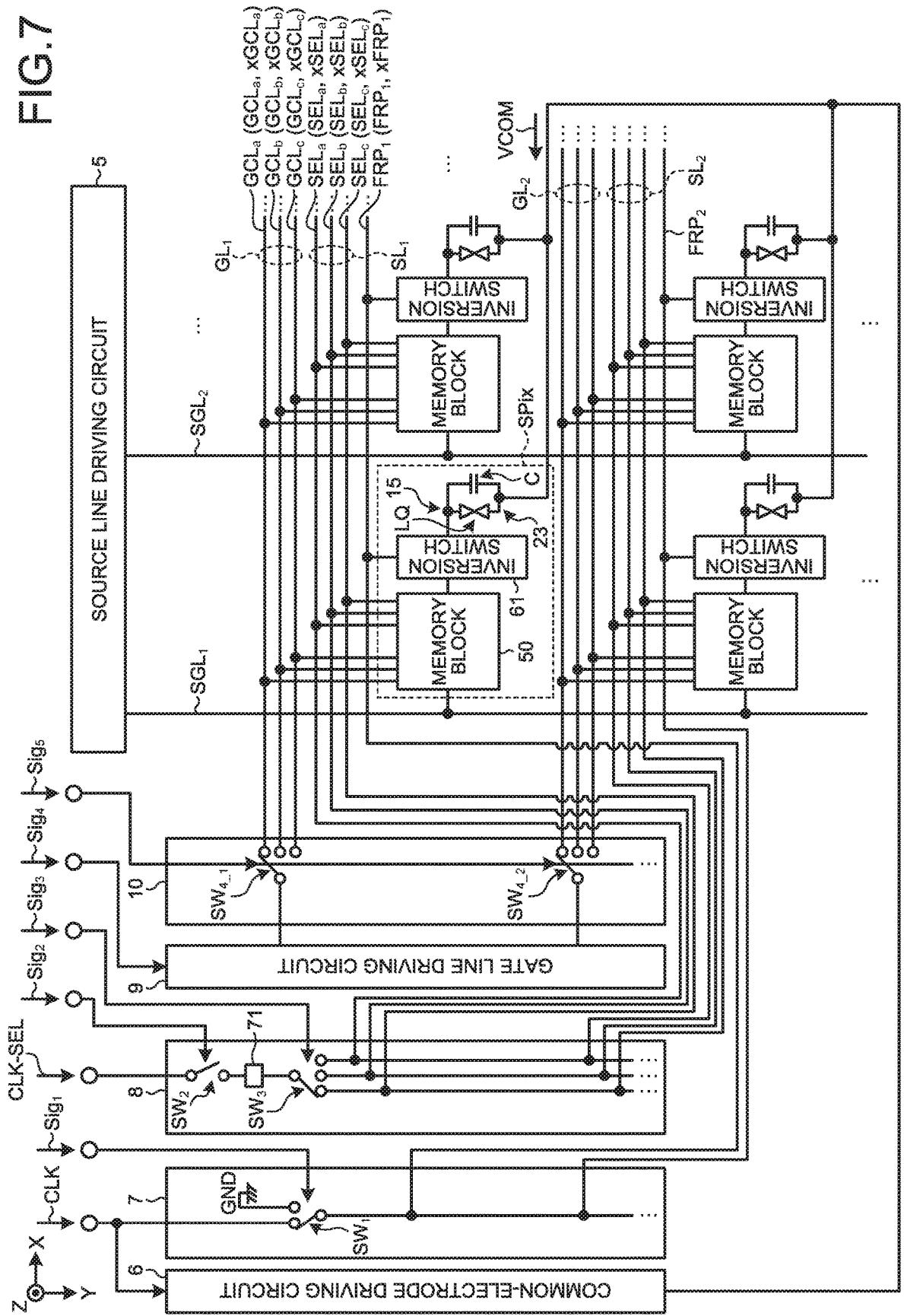
FIG. 7 illustrates a circuit configuration of the display device in the first embodiment.

FIG. 7 illustrates a circuit configuration of the display device in the first embodiment. FIG. 7 illustrates the sub-pixels SPix in a 2-by-2 matrix among the sub-pixels SPix.

Each of the sub-pixels SPix includes, in addition to the memory block 50 and the inversion switch 61, liquid crystal LQ, a holding capacitance C, and the sub-pixel electrode 15 (see FIG. 2).

The common-electrode driving circuit 6 varies a common potential VCOM common to the sub-pixels SPix in synchronization and in phase with the reference clock signal CLK, and outputs the thus varied common potential VCOM to the common electrode 23 (see FIG. 2). The common-electrode driving circuit 6 may output, to the common electrode 23, the reference clock signal CLK as it is as the common potential VCOM, or may output the reference clock signal CLK as the common potential VCOM to the common electrode 23 via a buffer circuit that amplifies a current driving capability.

The gate line driving circuit 9 includes M output terminals corresponding to the M rows of pixels Pix. Based on a control signal $Sig_4$ supplied from the timing controller 4b, the gate line driving circuit 9 sequentially outputs the gate signal from the M output terminals, the gate signal serving as a signal for selecting one of the M rows.

The gate line driving circuit 9 may be a scanner circuit that sequentially outputs the gate signal from M output terminals based on control signals $Sig_4$ (a scan start signal and a clock pulse signal). Alternatively, the gate line driving circuit 9 may be a decoder circuit that decodes the control signal $Sig_4$ that has been encoded and outputs the gate signal to the output terminal that is designated by the control signal $Sig_4$.

The gate line selection circuit 10 includes M switches $SW_{4\_1}$, $SW_{4\_2}$, . . . corresponding to the M rows of pixels Pix. The M switches $SW_{4\_1}$, $SW_{4\_2}$, . . . are uniformly controlled in accordance with a control signal $Sig_5$ supplied from the timing controller 4b.

On the first panel 2, M gate line groups $GL_1$, $GL_2$, . . . are disposed corresponding to the pixels Pix in the respective M rows. Each of the M gate line groups $GL_1$, $GL_2$, . . . includes a first gate line $GCL_a$, a second gate line $GCL_b$, and a third gate line $GCL_c$. The first gate line $GCL_a$ is electrically coupled to the first memories 51 (see FIG. 3) of the corresponding row, the second gate line $GCL_b$ is electrically coupled to the second memories 52 (see FIG. 3) thereof, and the third gate line $GCL_c$ is electrically coupled to the third memories 53 (see FIG. 3) thereof. Each of the M gate line groups $GL_1$, $GL_2$, . . . is parallel to the X direction in the display region DA (see FIG. 1).

Each of the M switches $SW_{4\_1}$, $SW_{4\_2}$, . . . electrically couples the corresponding output terminal of the gate line driving circuit 9 to the corresponding first gate line $GCL_a$ if the control signal $Sig_5$ is set to a first value. Each of the M switches $SW_{4\_1}$, $SW_{4\_2}$, . . . electrically couples the corresponding output terminal of the gate line driving circuit 9 to the corresponding second gate line $GCL_b$ if the control signal $Sig_5$ is set to a second value. Each of the M switches $SW_{4\_1}$, $SW_{4\_2}$, . . . electrically couples the corresponding output terminal of the gate line driving circuit 9 to the corresponding third gate line $GCL_c$ if the control signal $Sig_5$ is set to a third value.

When the output terminal of the gate line driving circuit 9 and the corresponding first gate line $GCL_a$ are electrically coupled together, the gate signal is supplied to the first memories 51 of the corresponding sub-pixels SPix. When the output terminal of the gate line driving circuit 9 and the corresponding second gate line $GCL_b$ are electrically coupled together, the gate signal is supplied to the second memories 52 of the corresponding sub-pixels SPix. When the output terminal of the gate line driving circuit 9 and the corresponding third gate line $GCL_c$ are electrically coupled together, the gate signal is supplied to the third memories 53 of the corresponding sub-pixels SPix.

On the first panel 2, N×3 source lines $SGL_1$, $SGL_2$, . . . are disposed corresponding to N×3 columns of the sub-pixels SPix. Each of the source lines $SGL_1$, $SGL_2$, . . . is parallel to the Y direction in the display region DA (see FIG. 1). The source line driving circuit 5 outputs the sub-pixel data to one of the three memories in each of the sub-pixels SPix through a corresponding one of the source lines $SGL_1$, $SGL_2$, . . . , the one memory having been selected by being supplied with the gate signal.

In accordance with the gate line GCL supplied with the gate signal, each of the sub-pixels SPix that belong to one row to which the gate signal has been supplied stores sub-pixel data in one memory among the first memory 51 to the third memory 53 therein, the sub-pixel data having been supplied through the corresponding source line SGL.

The memory selection circuit 8 includes a switch $SW_2$, a latch 71, and another switch $SW_3$. The switch $SW_2$ is controlled by a control signal $Sig_2$ supplied from the timing controller 4b.

The following describes operation to be performed when an image is displayed, that is, operation to be performed when the image data is read out from the M×N×3 first memories 51, the M×N×3 second memories 52, or the M×N×3 third memories 53. In this operation, the timing controller 4b outputs the control signal $Sig_2$ set to the first value to the switch $SW_2$. The switch $SW_2$ is turned on based on the control signal $Sig_2$ set to the first value and supplied from the timing controller 4b. Thus, the selected clock signal CLK-SEL is supplied to the latch 71.

The following describes operation to be performed when no image is displayed, that is, when no image data is read out from any of the M×N×3 first memories 51, the M×N×3 second memories 52, and the M×N×3 third memories 53. In this operation, the timing controller 4b outputs the control signal $Sig_2$ set to the second value to the switch $SW_2$. The switch $SW_2$ is turned off based on the control signal $Sig_2$ set to the second value and supplied from the timing controller 4b. Thus, the selected clock signal CLK-SEL is kept from being supplied to the latch 71.

When the selected clock signal CLK-SEL is supplied to the latch 71 with the switch $SW_2$ on, the latch 71 holds the high level of the selected clock signal CLK-SEL for one period of the selected clock signal CLK-SEL. When the selected clock signal CLK-SEL is not supplied to the latch 71 with the switch $SW_2$ off, the latch 71 holds the high level thereof.

On the first panel 2, M memory selection line groups $SL_1$, $SL_2$, . . . are disposed corresponding to the M rows of pixels Pix. Each of the M memory selection line groups $SL_1$, $SL_2$, . . . includes: a first memory selection line $SEL_a$, a second memory selection line $SEL_b$, and a third memory selection line $SEL_c$. The first memory selection line $SEL_a$ is electrically coupled to the first memories 51 of the corresponding row, the second memory selection line $SEL_b$ is electrically coupled to the second memories 52 thereof, and the third memory selection line $SEL_c$ is electrically coupled to the third memories 53 thereof. Each of the M memory selection line groups $SL_1$, $SL_2$, . . . is parallel to the X direction in the display region DA (see FIG. 1).

The switch $SW_3$ is controlled by a control signal $Sig_3$ supplied from the timing controller 4b. The switch $SW_3$ electrically couples the output terminal of the latch 71 to the first memory selection lines $SEL_a$ in the respective M memory selection line groups $SL_1$, $SL_2$, . . . if the control signal $Sig_3$ is set to the first value. The switch $SW_3$ electrically couples the output terminal of the latch 71 to the second memory selection lines $SEL_b$ in the respective M memory selection line groups $SL_1$, $SL_2$, . . . if the control signal $Sig_3$ is set to the second value. The switch $SW_3$ electrically couples the output terminal of the latch 71 to the third memory selection lines $SEL_c$ in the respective M memory selection line groups $SL_1$, $SL_2$, . . . if the control signal $Sig_3$ is set to the third value.

Each of the sub-pixels SPix modulates the liquid crystal layer based on the sub-pixel data stored in one memory among the first memory 51 to the third memory 53 corresponding to the memory selection line SEL to which a memory selection signal is supplied. Consequently, an image (frame) is displayed on the display surface.

On the first panel 2, M display signal lines $FRP_1$, $FRP_2$, . . . are disposed corresponding to the M rows of pixels Pix. Each of the M display signal lines $FRP_1$, $FRP_2$, . . . extends in the X direction in the display region DA (see FIG. 1). In a configuration such that the inversion switch 61 operates based not only on a display signal (non-inverted display signal) but also on an inverted display signal obtained by inverting the display signal, a first display signal line FRP and a second display signal line xFRP are disposed for each row.

The one or two display signal lines disposed for each row are an example of a display signal line.

The inversion driving circuit 7 includes a switch $SW_1$. The switch $SW_1$ is controlled by a control signal $Sig_1$ supplied from the timing controller 4b. The switch $SW_1$ supplies the reference clock signal CLK to the display signal lines $FRP_1$, $FRP_2$, . . . if the control signal $Sig_1$ is set to the first value. Thus, the potential of the sub-pixel electrodes 15 is inverted in synchronization with the reference clock signal CLK. The switch $SW_1$ supplies the reference potential (ground potential) GND to the display signal lines $FRP_1$, $FRP_2$, . . . if the control signal $Sig_1$ is set to the second value.

Figure 8:
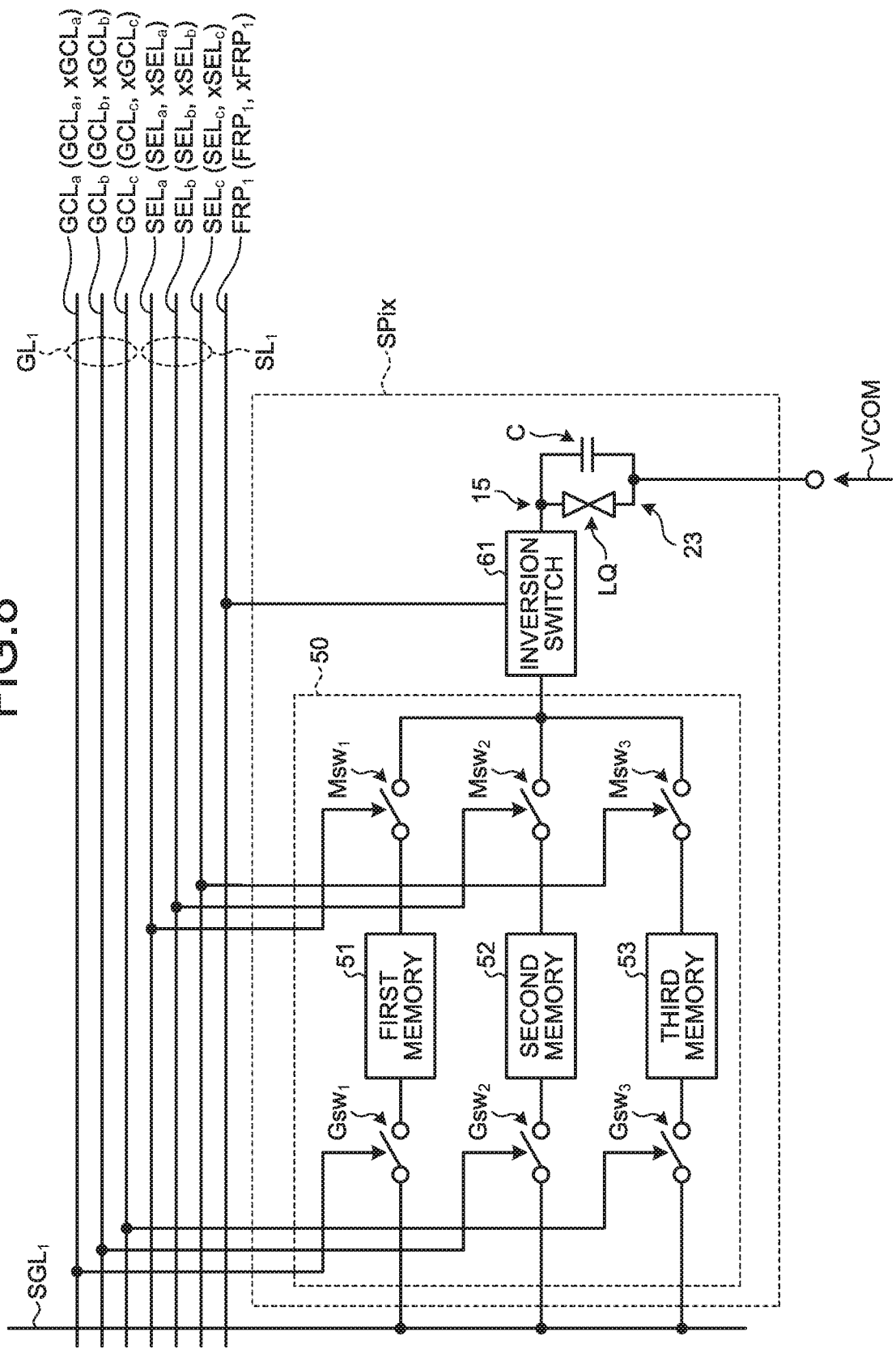
FIG. 8 illustrates a circuit configuration of the sub-pixel of the display device in the first embodiment.

FIG. 8 illustrates a circuit configuration of the sub-pixel SPix of the display device 1 in the first embodiment. FIG. 8 illustrates one of the sub-pixels SPix.

The sub-pixel SPix includes the memory block 50. The memory block 50 includes the first memory 51, the second memory 52, the third memory 53, switches $Gsw_1$ to $Gsw_3$, and switches $Msw_1$ to $Msw_3$.

A control input terminal of the switch $Gsw_1$ is electrically coupled to the first gate line $GCL_a$. When a high-level gate signal is supplied to the first gate line $GCL_a$, the switch $Gsw_1$ is turned on to electrically couple the source line $SGL_1$ to an input terminal of the first memory 51. Thus, the sub-pixel data supplied to the source line $SGL_1$ is stored in the first memory 51.

A control input terminal of the switch $Gsw_2$ is electrically coupled to the second gate line $GCL_b$. When a high-level gate signal is supplied to the second gate line $GCL_b$, the switch $Gsw_2$ is turned on to electrically couple the source line $SGL_1$ to an input terminal of the second memory 52. Thus, the sub-pixel data supplied to the source line $SGL_1$ is stored in the second memory 52.

A control input terminal of the switch $Gsw_3$ is electrically coupled to the third gate line $GCL_c$. When a high-level gate signal is supplied to the third gate line $GCL_c$, the switch $Gsw_3$ is turned on to electrically couple the source line $SGL_1$ to an input terminal of the third memory 53. Thus, the sub-pixel data supplied to the source line $SGL_1$ is stored in the third memory 53.

In a configuration such that the switches $Gsw_1$ to $Gsw_3$ each operate with a high-level gate signal, the gate line group $GL_1$ includes the first gate line $GCL_a$ to the third gate line $GCL_c$ as illustrated in FIG. 8. While a switch that operates based on a high-level gate signal is exemplified by an N-channel transistor, the present disclosure is not limited thereto.

Instead, in a configuration such that each of the switches $Gsw_1$ to $Gsw_3$ operates based not only on the gate signal but also on the inverted gate signal obtained by inverting the gate signal, the gate line group $GL_1$ includes not only the first gate line $GCL_a$ to the third gate line $GCL_c$ but also fourth gate line $xGCL_a$ to sixth gate line $xGCL_c$ to each of which the inverted gate signal is supplied. While a switch that operates based on the gate signal and the inverted gate signal is exemplified by a transfer gate, the present disclosure is not limited thereto.

The inverted gate signal can be supplied to the fourth gate line $xGCL_a$ when the display device 1 includes an inverter circuit including an input terminal electrically coupled to the first gate line $GCL_a$ and an output terminal electrically coupled to the fourth gate line $xGCL_a$. Likewise, the inverted gate signal can be supplied to the fifth gate line $xGCL_b$ when the display device 1 includes an inverter circuit including an input terminal electrically coupled to the second gate line $GCL_b$ and an output terminal electrically coupled to the fifth gate line $xGCL_b$. Likewise, the inverted gate signal can be supplied to the sixth gate line $xGCL_c$ when the display device 1 includes an inverter circuit including an input terminal electrically coupled to the third gate line $GCL_c$ and an output terminal electrically coupled to the sixth gate line $xGCL_c$.

A control input terminal of the switch $Msw_2$ is electrically coupled to the first memory selection line $SEL_b$. When a high-level memory selection signal is supplied to the second memory selection line $SEL_b$, the switch $Msw_2$ is turned on and electrically couples the output terminal of the first memory 52 to an input terminal of the inversion switch 61. Thus, the sub-pixel data stored in the second memory 52 is supplied to the inversion switch 61.

A control input terminal of the switch $Msw_2$ is electrically coupled to the second memory selection line $SEL_B$. When a high-level memory selection signal is supplied to the second memory selection line $SEL_B$, the switch $Msw_2$ is turned on and electrically couples the output terminal of the second memory 52 to the input terminal of the inversion switch 61. Thus, the sub-pixel data stored in the second memory 52 is supplied to the inversion switch 61.

A control input terminal of the switch $Msw_3$ is electrically coupled to the third memory selection line $SEL_C$. When a high-level memory selection signal is supplied to the third memory selection line $SEL_C$, the switch $Msw_3$ is turned on and electrically couples the output terminal of the third memory 53 to the input terminal of the inversion switch 61. Thus, the sub-pixel data stored in the third memory 53 is supplied to the inversion switch 61.

In a configuration such that each of the switches $Msw_1$ to $Msw_3$ operates based on a high-level memory selection signal, the memory selection line group $SL_1$ includes the first memory selection line $SEL_a$ to the third memory selection line $SEL_c$ as illustrated in FIG. 8. While a switch that operates based on a high-level gate signal is exemplified by an N-channel transistor, the present disclosure is not limited thereto.

Instead, in a configuration such that each of the switches $Msw_1$ to $Msw_3$ operates based not only on the memory selection signal but also on the inverted memory selection signal obtained by inverting the memory selection signal, the memory selection line group $SL_1$ includes not only the first memory selection line $SEL_a$ to the third memory selection line $SEL_c$ but also fourth memory selection line $xSEL_a$ to sixth memory selection line $xSEL_c$ to each of which the inverted memory selection signal is supplied. While a switch that operates based on the memory selection signal and the inverted memory selection signal is exemplified by a transfer gate, the present disclosure is not limited thereto.

The inverted memory selection signal can be supplied to the fourth memory selection line $xSEL_a$ when the display device 1 includes an inverter circuit having an input terminal electrically coupled to the first memory selection line $SEL_a$ and an output terminal electrically coupled to the fourth memory selection line $xSEL_a$. Likewise, the inverted memory selection signal can be supplied to the fifth memory selection line $xSEL_b$ when the display device 1 includes an inverter circuit having an input terminal electrically coupled to the second memory selection line $SEL_b$ and an output terminal electrically coupled to the fifth memory selection line $xSEL_b$. Likewise, the inverted memory selection signal can be supplied to the sixth memory selection line $xSEL_c$ when the display device 1 includes an inverter circuit having an input terminal electrically coupled to the third memory selection line $SEL_c$ and an output terminal electrically coupled to the sixth memory selection line $xSEL_c$.

A display signal that varies in synchronization and in phase with the reference clock signal CLK is supplied to the inversion switch 61 from a first display signal line $FRP_1$. An inverted display signal that varies in synchronization and in opposite phase with the reference clock signal CLK is supplied to the inversion switch 61 from the second display signal line $xFRP_1$. Based on the display signal (non-inverted display signal) and the inverted display signal, the inversion switch 61 supplies, to the sub-pixel electrode 15, the sub-pixel data stored in the first memory 51, the second memory 52, or the third memory 53 as it is or after inverting it. The liquid crystal LQ and the holding capacitance C are interposed between the sub-pixel electrode 15 and the common electrode 23. The holding capacitance C holds the voltage between the sub-pixel electrode 15 and the common electrode 23. Molecules in the liquid crystal LQ change in orientation based on the voltage between the sub-pixel electrode 15 and the common electrode 23, so that a sub-pixel image is displayed. A configuration without the holding capacitance C can be employed alternatively.

In a configuration such that the inversion switch 61 operates based on the display signal, only the first display signal line $FRP_1$ is included. Instead, in a configuration such that the inversion switch 61 operates based not only on the display signal but also on the inverted display signal obtained by inverting the display signal, the second display signal line $xFRP_1$ is included in addition to the first display signal line $FRP_1$. Further, the display device 1 includes an inverter circuit including an input terminal electrically coupled to the first display signal line $FRP_1$ and an output terminal electrically coupled to the second display signal line $xFRP_1$. Thus, the inverted display signal can be supplied to the second display signal line $xFRP_1$.

Figure 9:
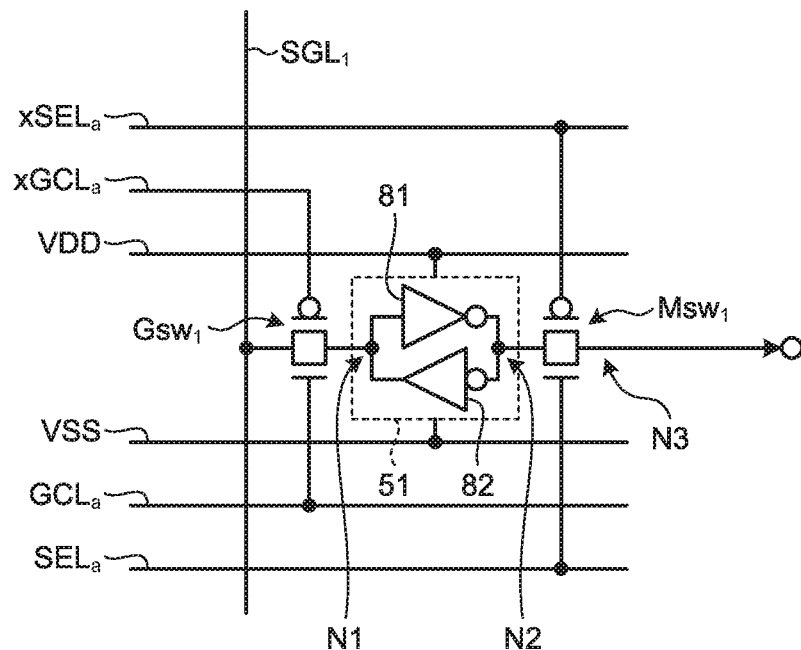
FIG. 9 illustrates a circuit configuration of a memory in the sub-pixel of the display device in the first embodiment.

FIG. 9 illustrates a circuit configuration of a memory in the sub-pixel SPix of the display device 1 in the first embodiment. FIG. 9 illustrates the circuit configuration of the first memory 51. The circuit configurations of the second memory 52 and the third memory 53 are identical to the circuit configuration of the first memory 51, and illustration and description thereof are therefore omitted.

The first memory 51 has a static random access memory (SRAM) cell structure that includes an inverter circuit 81 and another inverter circuit 82. The inverter circuit 82 is electrically coupled to the inverter circuit 81 in parallel thereto and in a direction opposite to the direction thereof. The input terminal of the inverter circuit 81 and the output terminal of the inverter circuit 82 constitute a node N1, and the output terminal of the inverter circuit 81 and the input terminal of the inverter circuit 82 constitute a node N2. The inverter circuits 81 and 82 operate with power supplied from a high-potential power supply line VDD and a low-potential power supply line VSS.

The node N1 is electrically coupled to the output terminal of the switch $Gsw_1$. The node N2 is electrically coupled to the input terminal of the switch $Msw_1$.

FIG. 9 illustrates an example in which a transfer gate is used as the switch $Gsw_1$. One control input terminal of the switch $Gsw_1$ is electrically coupled to the first gate line $GCL_a$. The other control input terminal of the switch $Gsw_1$ is electrically coupled to the fourth gate line $xGCL_a$. The fourth gate line $xGCL_a$ is supplied with the inverted gate signal obtained by inverting the gate signal supplied to the first gate line $GCL_a$.

The input terminal of the switch $Gsw_1$ is electrically coupled to the source line $SGL_1$. The output terminal of the switch $Gsw_1$ is electrically coupled to the node N1. When the gate signal supplied to the first gate line $GCL_a$ is high-level and the inverted gate signal supplied to the fourth gate line $xGCL_a$ is low-level, the switch $Gsw_1$ is turned on and electrically couples the source line $SGL_1$ to the node N1. Thus, the sub-pixel data supplied to the source line $SGL_1$ is stored in the first memory 51.

FIG. 9 illustrates an example in which a transfer gate is used as the switch $Msw_1$. One control input terminal of the switch $Msw_1$ is electrically coupled to the first memory selection line $SEL_a$. The other control input terminal of the switch $Msw_1$ is electrically coupled to the fourth memory selection line xSEL$_a$. The fourth memory selection line xSEL$_a$ is supplied with the inverted memory selection signal obtained by inverting the memory selection signal supplied to the first memory selection line SEL$_a$.

The input terminal of the switch Msw$_1$ is electrically coupled to the node N2. The output terminal of the switch Msw$_1$ is electrically coupled to a node N3. The node N3 is an output node of the first memory 51 and is electrically coupled to the inversion switch 61 (see FIG. 8). When the memory selection signal supplied to the first memory selection line SEL$_a$ is high-level and the inverted memory selection signal supplied to the fourth memory selection line xSEL$_a$ is low-level, the switch Msw$_1$ is turned on. Thus, the node N2 is electrically coupled to the input terminal of the inversion switch 61 via the switch Msw$_1$ and the node N3. Thus, the sub-pixel data stored in the first memory 51 is supplied to the inversion switch 61.

When the switches Gsw$_1$ and Msw$_1$ are both off, the sub-pixel data circulates through a loop formed by the inverter circuits 81 and 82. The first memory 51 consequently keeps holding the sub-pixel data.

While the above description illustrates the first memory 51 as an SRAM in the first embodiment, the present disclosure is not limited to this example. Other examples of the first memory 51 include, but are not limited to, a dynamic random access memory (DRAM).

Figure 10:
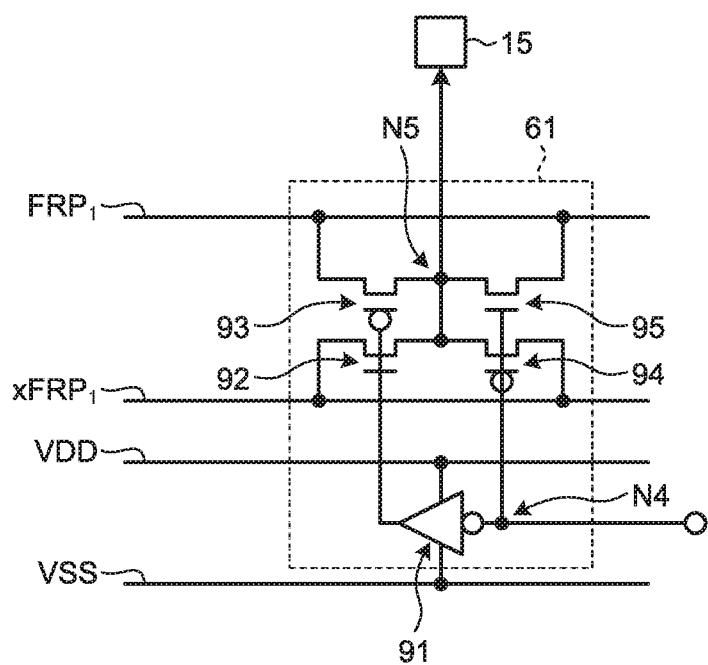
FIG. 10 illustrates a circuit configuration of an inversion switch in the sub-pixel of the display device in the first embodiment.

FIG. 10 illustrates a circuit configuration of the inversion switch 61 in the sub-pixel SPix of the display device 1 in the first embodiment. The inversion switch 61 includes an inverter circuit 91, N-channel transistors 92 and 95, and P-channel transistors 93 and 94.

The input terminal of the inverter circuit 91, the gate terminal of the P-channel transistor 94, and the gate terminal of the N-channel transistor 95 are coupled to a node N4. The node N4 is an input node of the inversion switch 61 and is electrically coupled to the nodes N3 of the first memory 51, the second memory 52, and the third memory 53. The sub-pixel data is supplied to the node N4 from the first memory 51, the second memory 52, and the third memory 53. The inverter circuit 91 operates with power supplied from the high-potential power supply line VDD and the low-potential power supply line VSS.

One of the source and the drain of the N-channel transistor 92 is electrically coupled to the second display signal line xFRP$_1$. The other one of the source and the drain of the N-channel transistor 92 is electrically coupled to a node N5.

One of the source and the drain of the P-channel transistor 93 is electrically coupled to the first display signal line FRP$_1$. The other one of the source and the drain of the P-channel transistor 93 is electrically coupled to the node N5.

One of the source and the drain of the P-channel transistor 94 is electrically coupled to the second display signal line xFRP$_1$. The other one of the source and the drain of the P-channel transistor 94 is electrically coupled to the node N5.

One of the source and the drain of the N-channel transistor 95 is electrically coupled to the first display signal line FRP$_1$. The other one of the source and the drain of the N-channel transistor 95 is electrically coupled to the node N5.

The node N5 is the output node of the inversion switch 61 and is electrically coupled to the reflective electrode (sub-pixel electrode) 15.

When the sub-pixel data supplied from the first memory 51, the second memory 52, or the third memory 53 is high-level, an output signal from the inverter circuit 91 is low-level. When an output signal from the inverter circuit 91 is low-level, the N-channel transistor 92 is off and the P-channel transistor 93 is on.

When the sub-pixel data supplied from the first memory 51, the second memory 52, or the third memory 53 is high-level, the P-channel transistor 94 is off and the N-channel transistor 95 is on.

Therefore, when the sub-pixel data supplied from the first memory 51, the second memory 52, or the third memory 53 is high-level, the display signal (non-inverted display signal) supplied to the first display signal line FRP$_1$ is supplied to the sub-pixel electrode 15 via the P-channel transistor 93 and the N-channel transistor 95.

The display signal supplied to the first display signal line FRP$_1$ varies in synchronization and in phase with the reference clock signal CLK. The common potential supplied to the common electrode 23 also varies in synchronization and in phase with the reference clock signal CLK. When the display signal and the common potential are in phase with each other, no voltage is applied to the liquid crystal LQ, and the molecules thereof do not change in orientation. Thus, the sub-pixel displays black (enters a state not transmitting the reflected light, that is, a state not displaying colors with the color filter not transmitting the reflected light). Thus, the display device 1 can implement a common inversion driving method.

When the sub-pixel data supplied from the first memory 51, the second memory 52, or the third memory 53 is low-level, an output signal from the inverter circuit 91 is high-level. When an output signal from the inverter circuit 91 is high-level, the N-channel transistor 92 is on and the P-channel transistor 93 is off.

When the sub-pixel data supplied from the first memory 51, the second memory 52, or the third memory 53 is low-level, the P-channel transistor 94 is on and the N-channel transistor 95 is off.

Therefore, when the sub-pixel data supplied from the first memory 51, the second memory 52, or the third memory 53 is low-level, the inverted display signal supplied to the second display signal line xFRP$_1$ is supplied to the sub-pixel electrode 15 via the P-channel transistor 92 and the N-channel transistor 94.

The inverted display signal supplied to the second display signal line xFRP$_1$ varies in synchronization and in opposite phase with the reference clock signal CLK. The common potential supplied to the common electrode 23 varies in synchronization and in phase with the reference clock signal CLK. When the inverted display signal and the common potential are out of phase with each other, voltage is applied to the liquid crystal LQ, and the molecules thereof change in orientation. Thus, the sub-pixel displays white (enters a state transmitting the reflected light, that is, a state displaying colors with the color filter transmitting the reflected light). Thus, the display device 1 can implement a common inversion driving method.

Figure 11:
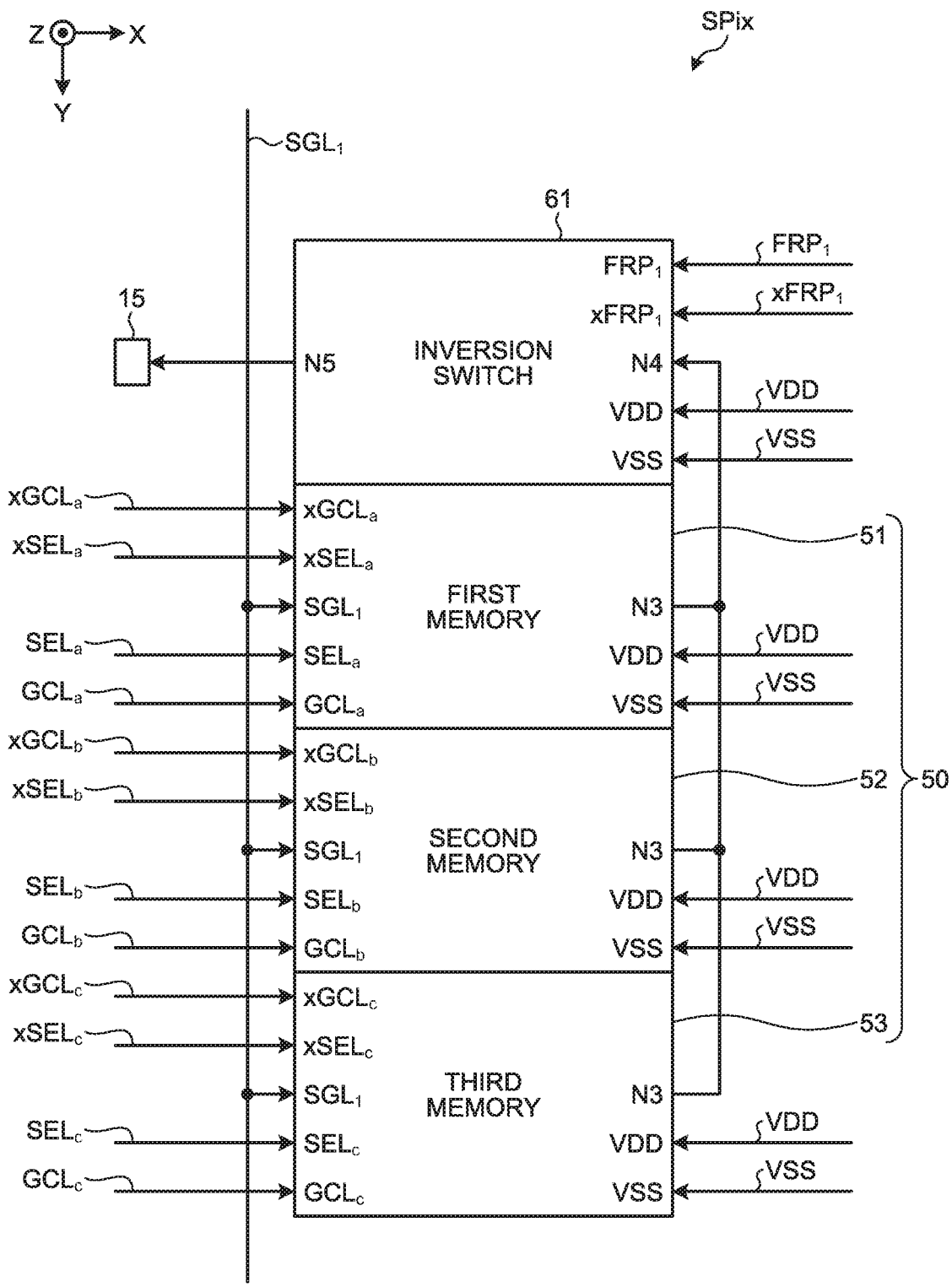
FIG. 11 schematically illustrates a layout in the sub-pixel of the display device in the first embodiment.

FIG. 11 schematically illustrates a layout in the sub-pixel SPix of the display device in the first embodiment.

The inversion switch 61, the first memory 51, the second memory 52, and the third memory 53 are arranged in the Y direction. The nodes N3, which are respective output nodes of the first memory 51, the second memory 52, and the third memory 53, are electrically coupled to the node N4, which is an input node of the inversion switch 61. The node N5, which is an output node of the inversion switch 61, is electrically coupled to the sub-pixel electrode 15.

The first memory 51 is electrically coupled to the first gate line GCL$_a$, the fourth gate line xGCL$_a$, the first memory selection line SEL$_a$, the fourth memory selection line xSEL$_a$, the source line SGL$_1$, the high-potential power supply line VDD, and the low-potential power supply line VSS.

The second memory 52 is electrically coupled to the second gate line GCL$_b$, the fifth gate line xGCL$_b$, the second memory selection line SEL$_b$, the fifth memory selection line xSEL$_b$, the source line SGL$_1$, the high-potential power supply line VDD, and the low-potential power supply line VSS.

The third memory 53 is electrically coupled to the third gate line GCL$_c$, the sixth gate line xGCL$_c$, the third memory selection line SEL$_c$, the sixth memory selection line xSEL$_c$, the source line SGL$_1$, the high-potential power supply line VDD, and the low-potential power supply line VSS.

The inversion switch 61 is electrically coupled to the display signal line FRP$_1$, the second display signal line xFRP$_1$, the high-potential power supply line VDD, and the low-potential power supply line VSS.

1-4. First Operation Example

Figure 12:
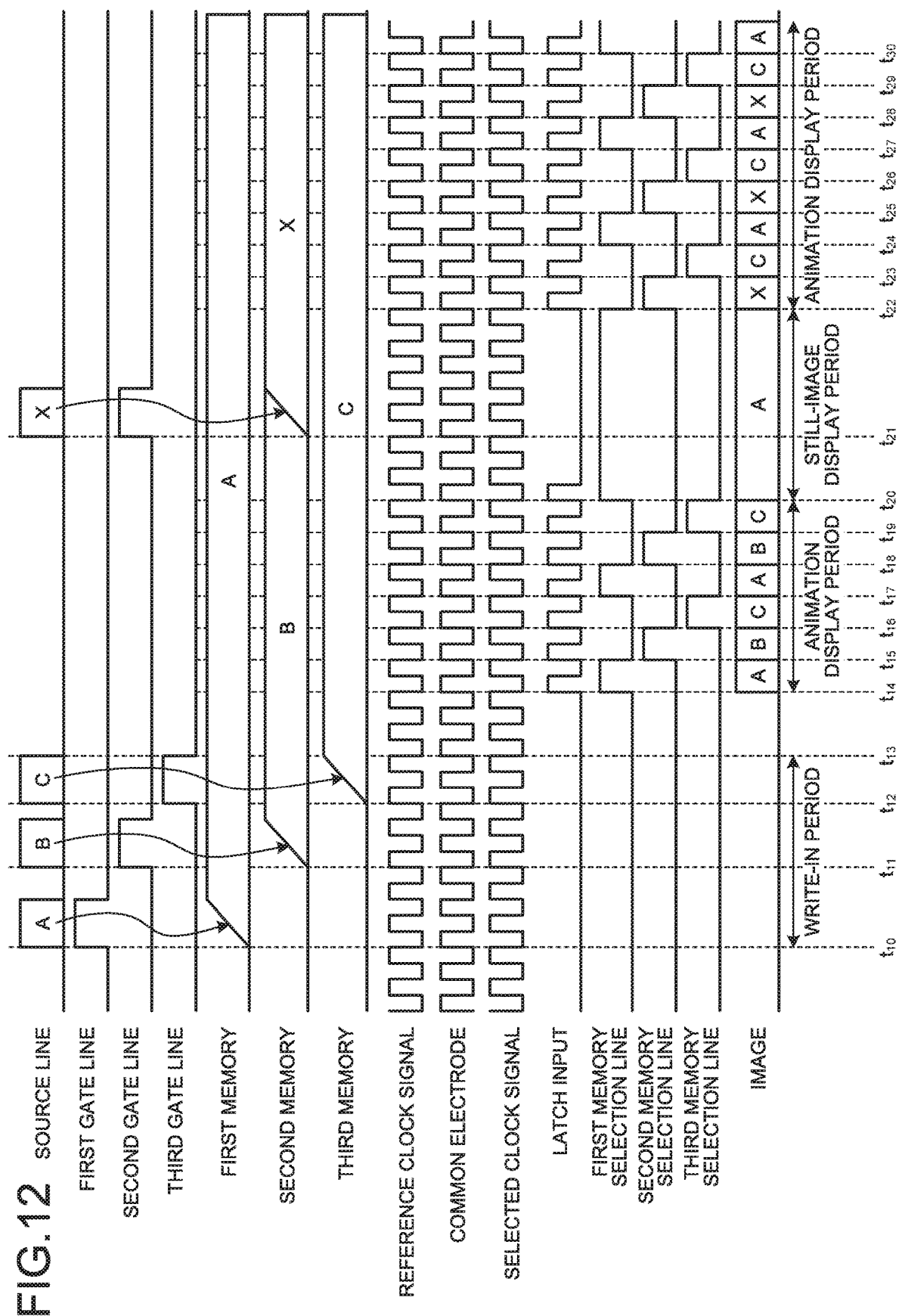
FIG. 12 is a timing chart illustrating first operation timings of the display device in the first embodiment.

FIG. 12 is a timing chart illustrating first operation timings of the display device 1 in the first embodiment.

Throughout the entire period in FIG. 12, the common-electrode driving circuit 6 supplies, to the common electrode 23, a common potential that is switched in synchronization with the reference clock signal CLK. The timing controller 4$b$ outputs a control signal Sig$_6$ to the selector 34$_1$ based on the values in the setting register 4$c$, the control signal Sig$_6$ being a signal for selecting the first frequency-divided clock signal CLK-X$_0$. Thus, the selector 34$_1$ selects the first frequency-divided clock signal CLK-X$_0$ as the selected clock signal CLK-SEL. The frequency of the selected clock signal CLK-SEL therefore equals the frequency of the reference clock signal CLK. The selector 34$_1$ outputs the selected clock signal CLK-SEL to the memory selection circuit 8.

A period from a timing t$_{10}$ to a timing t$_{13}$ is a write-in period in which to write the sub-pixel data into the first memory 51 to the third memory 53 included in each of N×3 sub-pixels SPix that belong to one of the rows.

At the timing t$_{10}$, the timing controller 4$b$ outputs the control signal Sig$_5$ set to the first value to the switch SW4 in the gate line selection circuit 10. The switch SW4 electrically couples the output terminal of the gate line driving circuit 9 to the first gate line GCL$_a$. The gate line driving circuit 9 outputs a gate signal to the first gate line GCL$_a$ of each of the rows. When a high-level gate signal is supplied to the first gate line GCL$_a$, the first memories 51 in the respective sub-pixels SPix that belong to the row are selected as memories into which the sub-pixel data is written.

At the timing t$_{10}$, the source line driving circuit 5 outputs sub-pixel data for displaying an image (frame) of "A" to the source lines SGL. Thus, the sub-pixel data for displaying the image (frame) of "A" is written into the first memories 51 in the respective sub-pixels SPix that belong to the row.

In a period from the timing t$_{10}$ to the timing t$_{11}$, this operation is line-sequentially performed on each of the first to the M-th rows. Thus, signals for forming the image of "A" are written into and stored in the first memories 51 in all of the sub-pixels SPix.

In a period from the timing t$_{11}$ to the timing t$_{12}$, the same operation as above is performed with respect to the second gate line GCL$_b$ and an image of "B". Thus, signals for forming the image of "B" are written into and stored in the second memories 52 in all of the sub-pixels SPix.

In a period from the timing t$_{12}$ to the timing t$_{13}$, the same operation as above is performed with respect to the third gate line GCL$_c$ and an image of "C". Thus, signals for forming the image of "C" are written into and stored in the third memories 53 in all of the sub-pixels SPix.

A period from a timing t$_{14}$ to a timing t$_{20}$ is an animation display (moving image display) period in which to sequentially switch an image to be displayed from one image to another among the three images of "A", "B", and "C" (three frames).

At the timing t$_{14}$, the timing controller 4$b$ outputs the control signal Sig$_2$ set to the first value to the switch SW$_2$ in the memory selection circuit 8. The switch SW$_2$ is turned on based on the control signal Sig$_2$ set to the first value and supplied from the timing controller 4$b$. Thus, the selected clock signal CLK-SEL is supplied to the latch 71.

At the timing t$_{14}$, the timing controller 4$b$ also outputs the control signal Sig$_3$ set to the first value to the switch SW$_3$ in the memory selection circuit 8. The switch SW$_3$ electrically couples the output terminal of the latch 71 to the first memory selection lines SEL$_a$ in the respective M memory selection line groups SL$_1$, SL$_2$, . . . . Thus, the memory selection signal is supplied to each of the first memory selection lines SEL$_a$ of the respective M memory selection line groups SL$_1$, SL$_2$, . . . .

The first memories 51 coupled to the respective first memory selection lines SEL$_a$ output the sub-pixel data for displaying the image of "A" to the corresponding inversion switches 61. Thus, at the timing t$_{14}$, the display device 1 displays the image of "A".

The image of "B" and the image of "C" are selected and displayed for periods from the timing t$_{15}$ to the timing t$_{16}$ and from the timing t$_{16}$ to the timing t$_{17}$, respectively, each through the same operation as the above one.

Operation that the components perform in a period from the timing t$_{17}$ to the timing t$_{19}$ is the same as operation that they perform in a period from the timing t$_{14}$ to the timing t$_{16}$. The description thereof is therefore omitted.

As described above, during the period from the timing t$_{14}$ to the timing t$_{20}$, the display device 1 can provide animation display (moving image display) that sequentially switches an image to be displayed from one image to another among the three images of "A", "B", and "C" (three frames).

A period from the timing t$_{20}$ to a timing t$_{22}$ is a still-image display period in which the image of "A" is displayed.

At the timing t$_{20}$, the timing controller 4$b$ outputs the control signal Sig$_2$ set to the second value to the switch SW$_2$ in the memory selection circuit 8. The switch SW$_2$ is turned off based on the control signal Sig$_2$ set to the second value and supplied from the timing controller 4$b$. Thus, the selected clock signal CLK-SEL is kept from being supplied to the latch 71. The latch 71 holds the high level.

At the timing t$_{20}$, the timing controller 4$b$ also outputs the control signal Sig$_3$ set to the first value to the switch SW$_3$ in the memory selection circuit 8. The switch SW$_3$ electrically couples the output terminal of the latch 71 to the first memory selection lines SEL$_a$ in the respective M memory selection line groups SL$_1$, SL$_2$, . . . . The display device 1 displays the image of "A" as a still image for a period from the timing t$_{20}$ to the timing t$_{22}$ through driving performed in the same manner as described above.

At the timing t$_{21}$ in the still-image display period for which the image of "A" is displayed as a still image, sub-pixel data for displaying an image of "X" is written into the second memories 52 in the respective sub-pixels SPix.

At the timing t$_{21}$, the timing controller 4$b$ outputs the control signal Sig$_5$ set to the second value to the switch SW$_4$ in the gate line selection circuit 10. The switch $SW_4$ electrically couples the output terminal of the gate line driving circuit 9 to the second gate line $GCL_b$. The gate line driving circuit 9 outputs a gate signal to the second gate line $GCL_b$ of each of the rows. When a high-level gate signal is supplied to the second gate line $GCL_b$, the second memories 52 in the respective sub-pixels SPix that belong to the row are selected as memories into which the sub-pixel data is written.

At the timing $t_{21}$, the source line driving circuit 5 outputs sub-pixel data for displaying the image of "X" to the source lines SGL. Thus, the sub-pixel data for displaying the image (frame) "X" is written into the individual second memories 52 in the respective sub-pixels SPix that belong to the row.

The display device 1 can write the sub-pixel data of the image of "X" into the second memories 52 in the respective sub-pixels SPix by repeating, M times, the same operation as the operation performed at the timing $t_{21}$.

FIG. 12 illustrates a case in which, at the timing $t_{21}$ in the still-image display period for which the image of "A" is displayed as a still image, the sub-pixel data for displaying the image "X" is written into the second memories 52 in the respective sub-pixels SPix. However, it is also possible to, for example, write the sub-pixel data for displaying the image of "X" into the second memories 52 in the respective sub-pixels SPix in a period from the timing $t_{16}$ to the timing $t_{18}$ for which the images "C" and "A" are displayed as animations (displayed as moving images) in the animation display (moving image display) period.

A period after the timing $t_{22}$ is an animation display (moving image display) period in which to sequentially switch an image to be displayed from one image to another among the three images of "X", "C", and "A" (three frames). Operation that the components perform in a period from the timing $t_{22}$ to a timing $t_{30}$ is the same as operation that they perform in the period from the timing $t_{14}$ to the timing $t_{16}$. The description thereof is therefore omitted.

1-5. Second Operation Example

Figure 13:
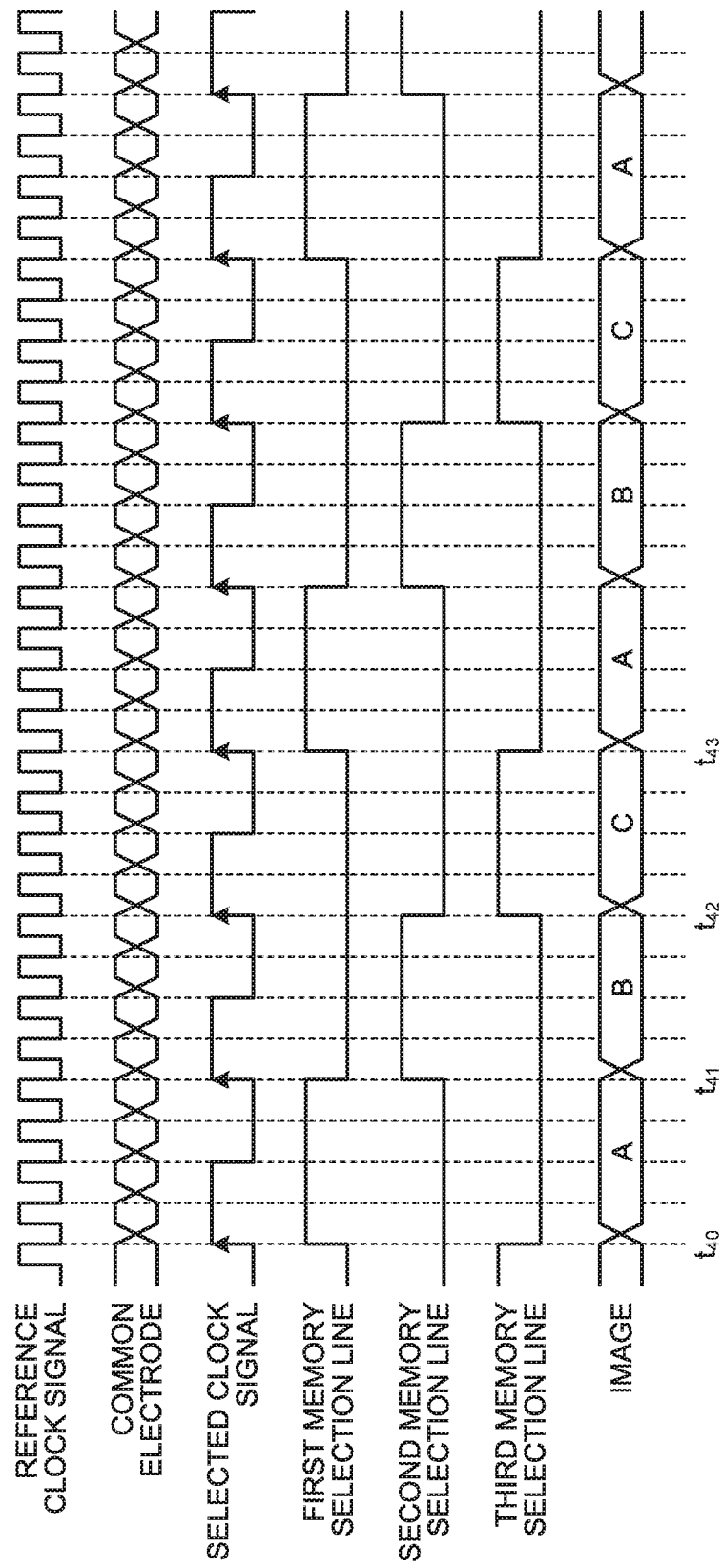
FIG. 13 is a timing chart illustrating second operation timings of the display device in the first embodiment.

FIG. 13 is a timing chart illustrating second operation timings of the display device in the first embodiment.

Throughout the entire period in FIG. 13, the common-electrode driving circuit 6 supplies, to the common electrode 23, a common potential that is switched in synchronization with the reference clock signal CLK. Based on the values in the setting register 4c, the timing controller 4b outputs, to the selector $34_1$, the control signal $Sig_6$ for selecting the third frequency-divided clock signal $CLK-X_2$. Thus, the selector $34_1$ selects the third frequency-divided clock signal $CLK-X_2$ as the selected clock signal CLK-SEL. The frequency of the selected clock signal CLK-SEL is therefore ¼ of the frequency of the reference clock signal CLK. The selector $34_1$ outputs the selected clock signal CLK-SEL to the memory selection circuit 8.

For example, the frequency of the reference clock signal CLK is exemplified as 1 Hz. The frequency at which the common potential of the common electrode 23 is switched is therefore 1 Hz. The frequency of the selected clock signal CLK-SEL is ¼ of the frequency of the reference clock signal CLK, that is, 0.25 Hz. The frequency at which frames are changed is therefore 0.25 Hz.

A period from a timing $t_{40}$ to a timing $t_{43}$ is an animation display (moving image display) period in which to sequentially switch an image to be displayed from one image to another among the three images of "A", "B", and "C" (three frames).

At the timing $t_{40}$, the timing controller 4b outputs the control signal $Sig_2$ set to the first value to the switch $SW_2$ in the memory selection circuit 8. The switch $SW_2$ is turned on based on the control signal $Sig_2$ set to the first value and supplied from the timing controller 4b. Thus, the selected clock signal CLK-SEL is supplied to the latch 71.

At the timing $t_{40}$, the timing controller 4b also outputs the control signal $Sig_3$ set to the first value to the switch $SW_3$ in the memory selection circuit 8. The switch $SW_3$ electrically couples the output terminal of the latch 71 to the first memory selection lines $SEL_a$ in the respective M memory selection line groups $SL_1$, $SL_2$, . . . . Thus, the memory selection signal is supplied to each of the first memory selection lines $SEL_a$ of the respective M memory selection line groups $SL_1$, $SL_2$, . . . .

The first memories 51 coupled to the respective first memory selection lines $SEL_a$ output the sub-pixel data for displaying the image of "A" to the corresponding inversion switches 61. Thus, at the timing $t_{40}$, the display device 1 displays the image of "A".

At the timing $t_{41}$, the same operation as above is performed with respect to the second memory selection line $SEL_b$ and the image of "B". Thus, at the timing $t_{41}$, the display device 1 displays the image "B".

At the timing $t_{42}$, the same operation as above is performed with respect to the third memory selection line $SEL_c$ and the image of "C". Thus, at the timing $t_{42}$, the display device 1 displays the image "C".

Operation that the components perform after the timing $t_{43}$ is the same as operation that they perform for a period from the timing $t_{40}$ to the timing $t_{42}$. The description thereof is therefore omitted.

As described above, during a period from the timing $t_{40}$ to the timing $t_{43}$, the display device 1 can provide animation display (moving image display) that sequentially switches a display image from one image to another among the three images of "A", "B", and "C" (three frames).

The display device 1 in the first embodiment is configured such that the memory selection circuit 8 disposed outside the display region DA concurrently selects the first memories 51, the second memories 52, or the third memories 53 in the respective sub-pixels SPix. Consequently, the display device 1 can display one image (one frame) among three images (three frames) by switching selection of a memory from one to another among the first memory 51 to the third memory 53 in each of the sub-pixels SPix. Thus, the display device 1 can change an entire display image in a short amount of time. The display device 1 enables animation display (moving image display) by sequentially switching selection of a memory from one to another among the first memory 51 to the third memory 53 in each of the sub-pixels SPix.

The display device 1 in the first embodiment is configured such that the gate line selection circuit 10 disposed in the frame region GD selects the first memories 51, the second memories 52, or the third memories 53 when sub-pixel data is written. The display device 1 is also configured such that the memory selection circuit 8 disposed in the frame region GD selects the first memories 51, the second memories 52, or the third memories 53 when sub-pixel data are read out. This configuration makes it unnecessary for the respective pixels Pix to include individual circuits for switching memories. Thus, the display device 1 can meet the demand for making image display panels further reduced in size and higher in definition.

The display device 1 in the first embodiment is also capable of, during a period for which an image is displayed based on sub-pixel data stored in memories that are the first memories 51, the second memories 52, or the third memories 53, writing sub-pixel data into other memories that are the first memories 51, the second memories 52, or the third memories 53. Thus, the display device 1 can also write sub-pixel data for an image while displaying another image.

The display device 1 in the first embodiment is configured such that, based on the control signal $Sig_6$, the selector $34_1$ selects one of the first frequency-divided clock signal CLK-$X_0$ to the fifth frequency-divided clock signal CLK-$X_4$ as the selected clock signal CLK-SEL. The selector $34_1$ then outputs the selected clock signal CLK-SEL to the memory selection circuit 8. Thus, the display device 1 is capable of causing the frequency at which images (frames) are switched to be changed without changing the frequency of the reference clock signal CLK supplied from the outside. The display device 1 is also capable of causing the frequency at which frames are switched and the frequency at which the potential of the common electrode 23 is inverted to be different from each other. Thus, the display device 1 is capable of causing the frequency at which frames are switched and the frequency at which the potential of the common electrode 23 is inverted to be different from each other in accordance with the manner in which the display device is used, without changing the frequency of the reference clock signal CLK. The display device 1 is therefore capable of causing the frequency at which frames are switched and the frequency at which the polarity of the common electrode 23 is inverted (at which the potential of the common electrode 23 is switched) to be different from each other in accordance with the manner in which the display device 1 is used.

The display device 1 in the first embodiment is capable of causing the frequency at which frames are switched to be changed based on the values in the setting register 4c. Therefore, the display device 1 is capable of, even when a frame is being displayed, causing the frequency at which frames are switched to be changed by having the values in the setting register 4c updated from an external circuit. The display device 1 is therefore capable of dynamically changing the frequency at which frames are changed, in accordance with the manner in which the display device 1 is used.

The display device 1 is used as an electronic shelf label in some cases. In such a case, it is desirable to dynamically change the frequency at which frames are switched. The display device 1 can meet such a desire.

In the first embodiment, the reference clock signal CLK is supplied to the common-electrode driving circuit 6 and the inversion driving circuit 7, and the selected clock signal CLK-SEL is supplied to the memory selection circuit 8. The present disclosure is not limited to this example. The reference clock signal CLK may be supplied to the memory selection circuit 8, and the selected clock signal CLK-SEL may be supplied to the common-electrode driving circuit 6 and the inversion driving circuit 7. Thus, the display device 1 is capable of causing the frequency at which frames are switched and the frequency at which the potential of the common electrode 23 is inverted to be different from each other in accordance with the manner in which the display device is used, without changing the frequency of the reference clock signal CLK.

2. Second Embodiment 2-1. Entire Configuration

Figure 14:
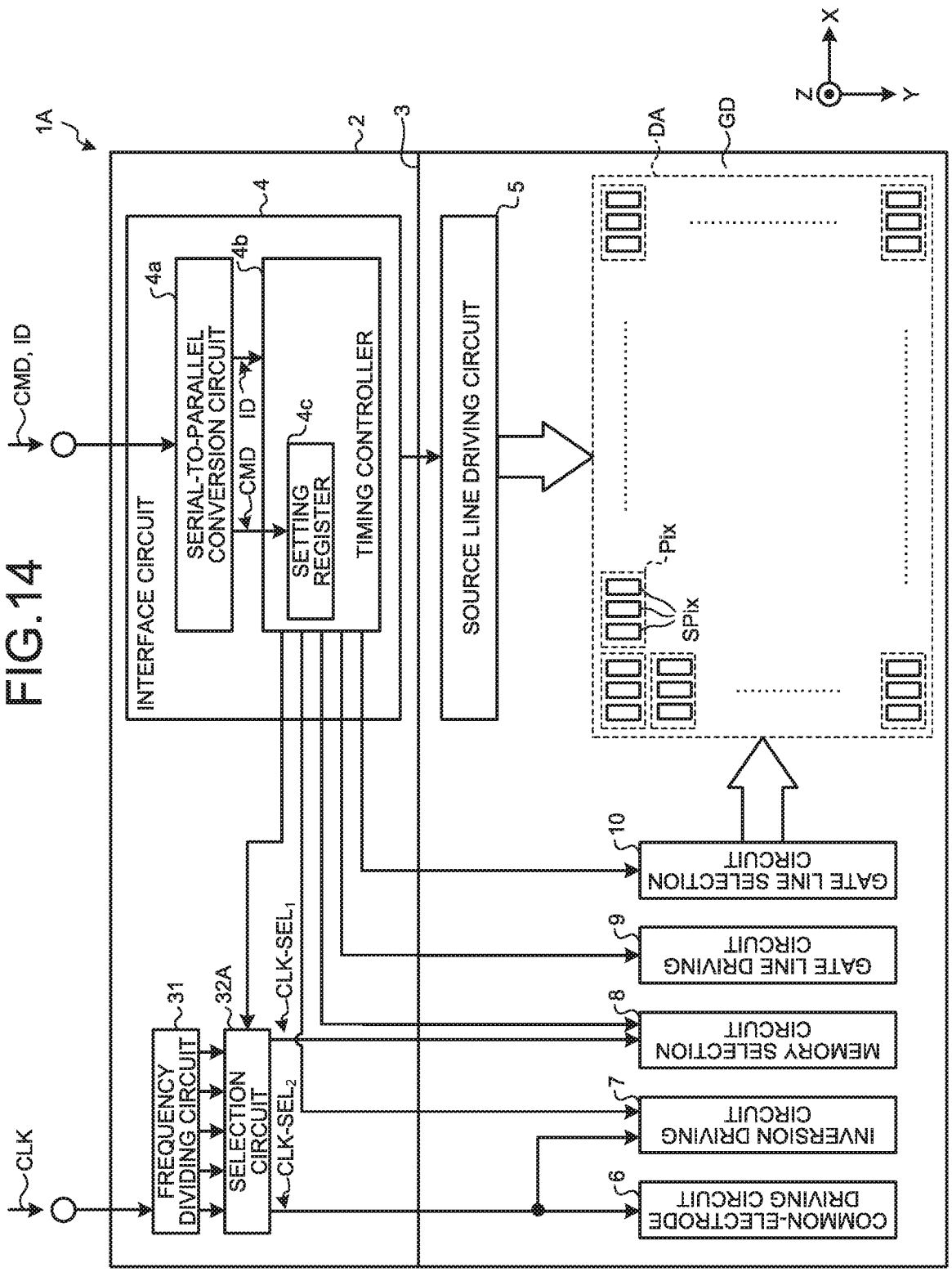
FIG. 14 schematically illustrates an entire configuration of a display device in a second embodiment.

FIG. 14 schematically illustrates an entire configuration of a display device 1A in a second embodiment.

The display device 1A includes a selection circuit 32A in place of the selection circuit 32 of the display device 1 in the first embodiment.

Based on the set values in the setting register 4c, the timing controller 4b controls the selection circuit 32A.

Under the control of the timing controller 4b, the selection circuit 32A selects one of the first frequency-divided clock signal CLK-$X_0$ to the fifth frequency-divided clock signal CLK-$X_4$ as a first selected clock signal CLK-$SEL_1$. The selection circuit 32A then outputs the first selected clock signal CLK-$SEL_1$ to the memory selection circuit 8. Under the control of the timing controller 4b, the selection circuit 32A selects one of the first frequency-divided clock signal CLK-$X_0$ to the fifth frequency-divided clock signal CLK-$X_4$ as a second selected clock signal CLK-$SEL_2$. The selection circuit 32A then outputs the second selected clock signal CLK-$SEL_2$ to the common-electrode driving circuit 6 and the inversion driving circuit 7. The respective frequencies of the first selected clock signal CLK-$SEL_1$ and the second selected clock signal CLK-$SEL_2$ may be equal to each other or may be different from each other.

Figure 15:
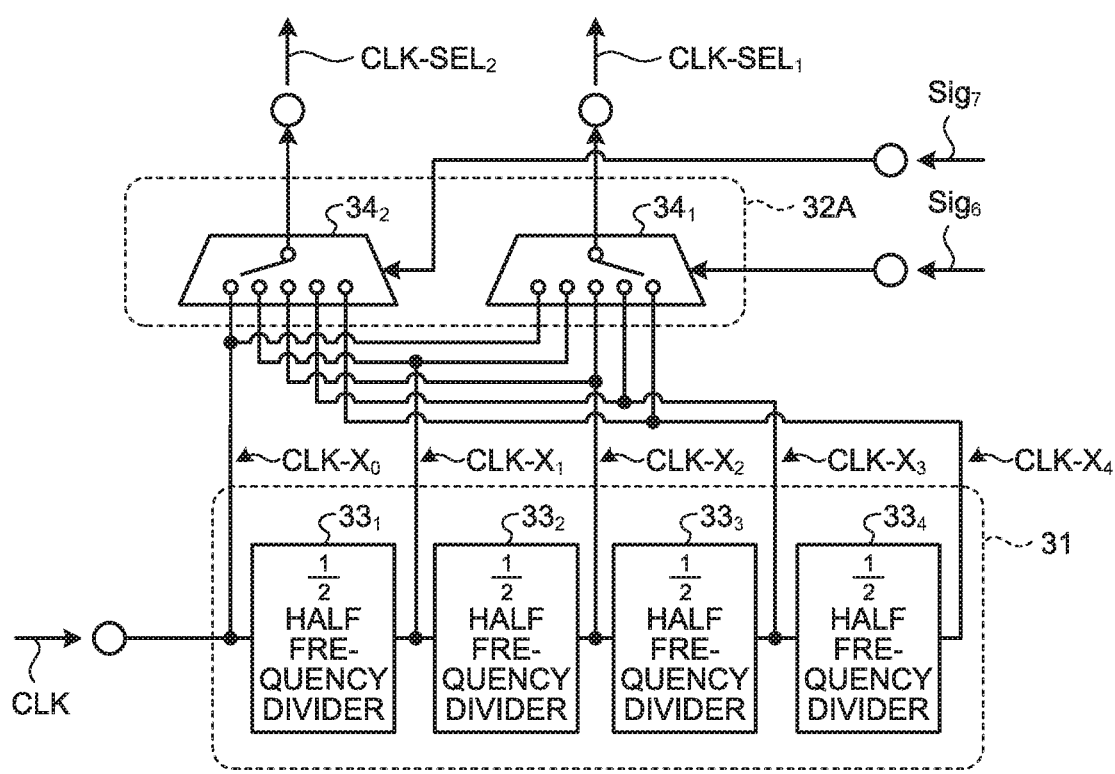
FIG. 15 illustrates circuit configurations of a frequency dividing circuit and a selection circuit of the display device in the second embodiment.

FIG. 15 illustrates circuit configurations of a frequency dividing circuit and a selection circuit of the display device in the second embodiment.

The frequency dividing circuit 31 includes the first half frequency divider $33_1$ to the fourth half frequency divider $33_4$ that are coupled to one another in a daisy chain fashion. The selection circuit 32A includes a first selector $34_1$ and a second selector $34_2$.

The first frequency-divided clock signal CLK-$X_0$ to the fifth frequency-divided clock signal CLK-$X_4$ are supplied to the first selector $34_1$. Based on a control signal $Sig_6$ supplied from the timing controller 4b, the selector $34_1$ selects one frequency-divided clock signal out of the first frequency-divided clock signal CLK-$X_0$ to the fifth frequency-divided clock signal CLK-$X_4$ as the first selected clock signal CLK-$SEL_1$. The first selector $34_1$ outputs the first selected clock signal CLK-$SEL_1$ to the memory selection circuit 8.

The first frequency-divided clock signal CLK-$X_0$ to the fifth frequency-divided clock signal CLK-$X_4$ are supplied to the second selector $34_2$. Based on a control signal $Sig_7$ supplied from the timing controller 4b, the second selector $34_2$ selects one of the first frequency-divided clock signal CLK-$X_0$ to the fifth frequency-divided clock signal CLK-$X_4$ as the second selected clock signal CLK-$SEL_2$. The second selector $34_2$ then outputs the second selected clock signal CLK-$SEL_2$ to the common-electrode driving circuit 6 and the inversion driving circuit 7.

Figure 16:
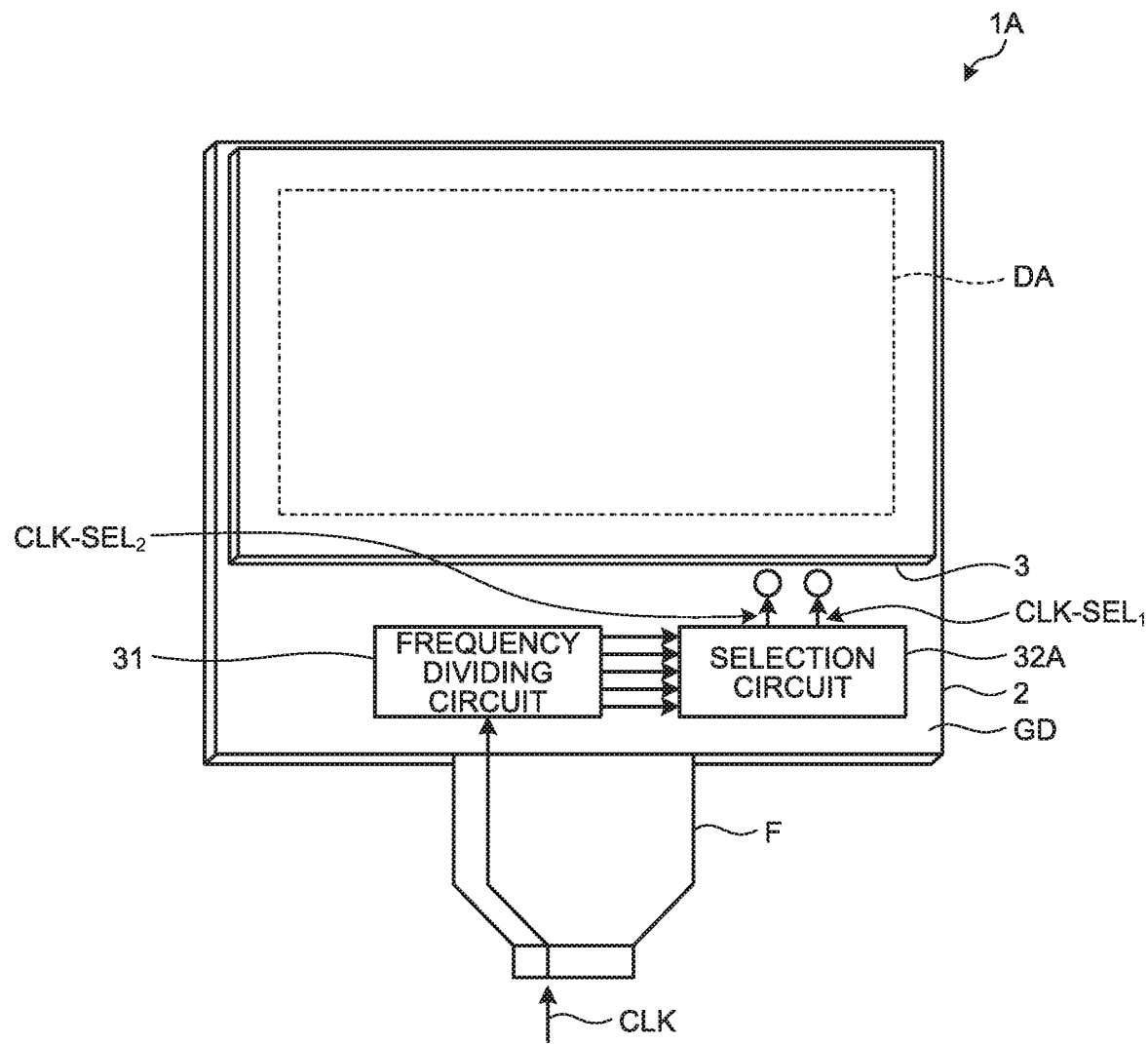
FIG. 16 illustrates a module configuration of the display device in the second embodiment.

FIG. 16 illustrates a module configuration of the display device in the second embodiment. In detail, FIG. 16 illustrates an arrangement of the frequency dividing circuit 31 and the selection circuit 32A in the display device 1A.

The frequency dividing circuit 31 and the selection circuit 32A are arranged in regions within the frame region GD and where the first panel 2 is not overlapped with the second panel 3. The first panel 2 has the flexible board F attached thereto. The reference clock signal CLK is supplied to the frequency dividing circuit 31 via the flexible board F.

The frequency dividing circuit 31 outputs, to the selection circuit 32A, the first frequency-divided clock signal CLK-$X_0$ to the fifth frequency-divided clock signal CLK-$X_4$ obtained by performing frequency division on the frequency of the reference clock signal CLK. The selection circuit 32A selects one of the first frequency-divided clock signal CLK-$X_0$ to the fifth frequency-divided clock signal CLK-$X_4$ as the first selected clock signal CLK-$SEL_1$. The selection circuit 32A then outputs the first selected clock signal CLK-$SEL_1$ to the memory selection circuit 8 (see FIG. 14). The selection circuit 32A selects one of the first frequency-divided clock signal CLK-$X_0$ to the fifth frequency-divided clock signal CLK-$X_4$ as the second selected clock signal CLK-$SEL_2$. The selection circuit 32A outputs the second selected clock signal $CLK\text{-}SEL_2$ to the common-electrode driving circuit 6 (see FIG. 14) and the inversion driving circuit 7 (see FIG. 14).

The frequency dividing circuit 31 and the selection circuit 32A may be implemented in the form of a COG on the first panel 2. Alternatively, the frequency dividing circuit 31 and the selection circuit 32A may be implemented in the form of a COF on the flexible board F.

Figure 17:
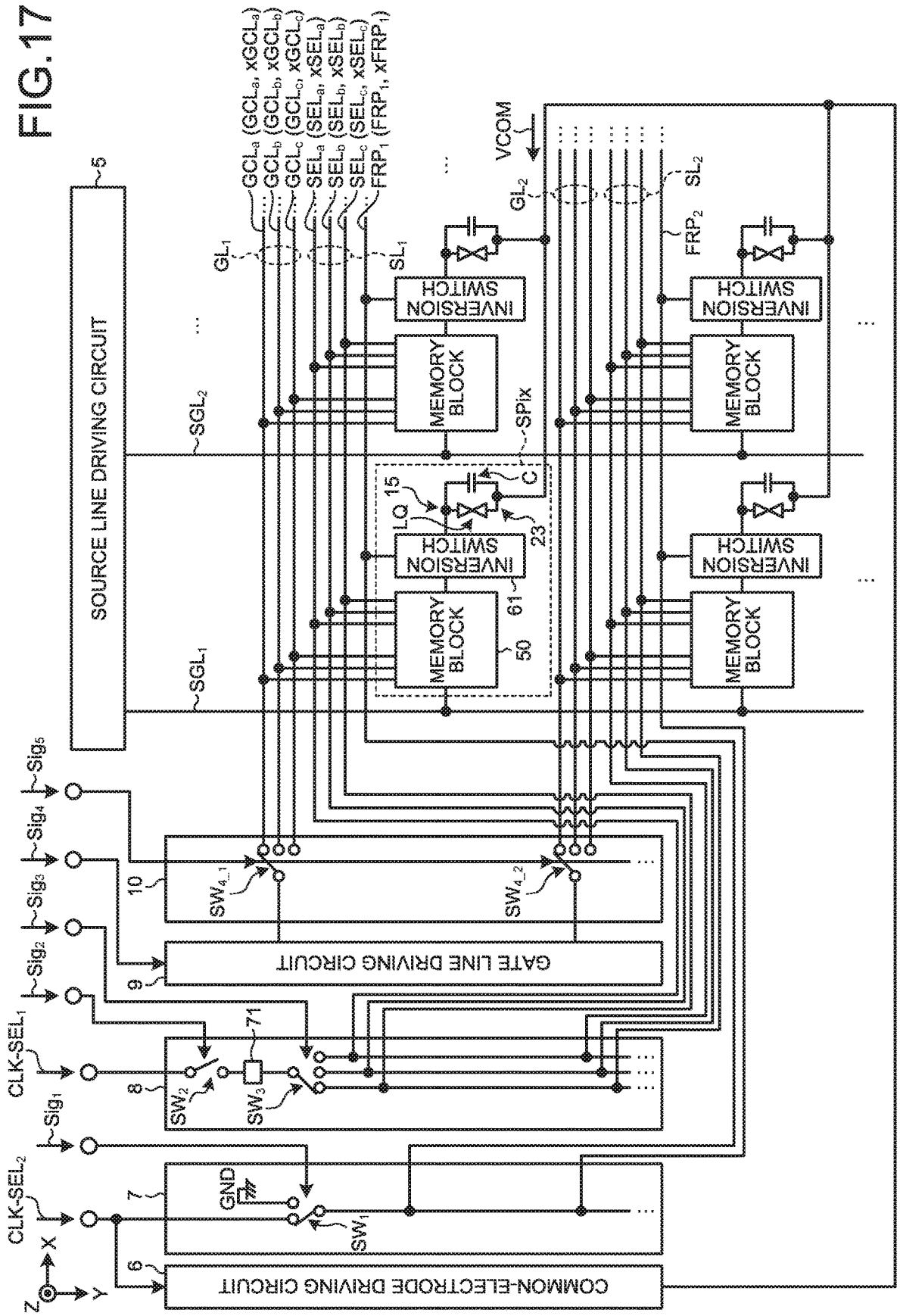
FIG. 17 illustrates a circuit configuration of the display device in the second embodiment.

FIG. 17 illustrates a circuit configuration of the display device in the second embodiment.

The memory selection circuit 8 includes the switch $SW_2$. The switch $SW_2$ is controlled by a control signal $Sig_2$ supplied from the timing controller 4b.

The following describes operation to be performed when an image is displayed, that is, operation to be performed when an image is read out from the M×N×3 first memories 51, the M×N×3 second memories 52, or the M×N×3 third memories 53. In this operation, the timing controller 4b outputs the control signal $Sig_2$ set to the first value to the switch $SW_2$. The switch $SW_2$ is turned on based on the control signal $Sig_2$ set to the first value and supplied from the timing controller 4b. Thus, the first selected clock signal $CLK\text{-}SEL_1$ is supplied to the latch 71.

The following describes operation to be performed when no image is displayed, that is, when no image data is read out from any of the M×N×3 first memories 51, the M×N×3 second memories 52, and the M×N×3 third memories 53. In this operation, the timing controller 4b outputs the control signal $Sig_2$ set to the second value to the switch $SW_2$. The switch $SW_2$ is turned off based on the control signal $Sig_2$ set to the second value and supplied from the timing controller 4b. Thus, the first selected clock signal $CLK\text{-}SEL_1$ is kept from being supplied to the latch 71.

When the first selected clock signal $CLK\text{-}SEL_1$ is supplied to the latch 71 with the switch $SW_2$ on, the latch 71 holds the high level of the first selected clock signal $CLK\text{-}SEL_1$ for one period of the first selected clock signal $CLK\text{-}SEL_1$. When the first selected clock signal $CLK\text{-}SEL_1$ is not supplied to the latch 71 with the switch $SW_2$ off, the latch 71 holds the high level thereof.

The common-electrode driving circuit 6 switches a common potential VCOM common to the sub-pixels SPix in synchronization with the second selected clock signal $CLK\text{-}SEL_2$ and outputs the thus switched common potential VCOM to the common electrode 23 (see FIG. 2). The common-electrode driving circuit 6 may output, to the common electrode 23, the second selected clock signal $CLK\text{-}SEL_2$ as it is as the common potential VCOM, or may output the second selected clock signal $CLK\text{-}SEL_2$ as the common potential VCOM to the common electrode 23 via a buffer circuit that amplifies a current driving capability.

The inversion driving circuit 7 includes the switch $SW_1$. The switch $SW_1$ is controlled by a control signal $Sig_1$ supplied from the timing controller 4b. The switch $SW_1$ supplies the second selected clock signal $CLK\text{-}SEL_2$ to the display signal lines $FRP_1$, $FRP_2$, . . . if the control signal $Sig_1$ is set to the first value. Thus, the potential of each of the sub-pixel electrodes 15 is inverted in synchronization with the second selected clock signal $CLK\text{-}SEL_2$. The switch $SW_1$ supplies the reference potential (ground potential) GND to the display signal lines $FRP_1$, $FRP_2$, . . . if the control signal $Sig_1$ is set to the second value.

2-2. First Operation Example

Figure 18:
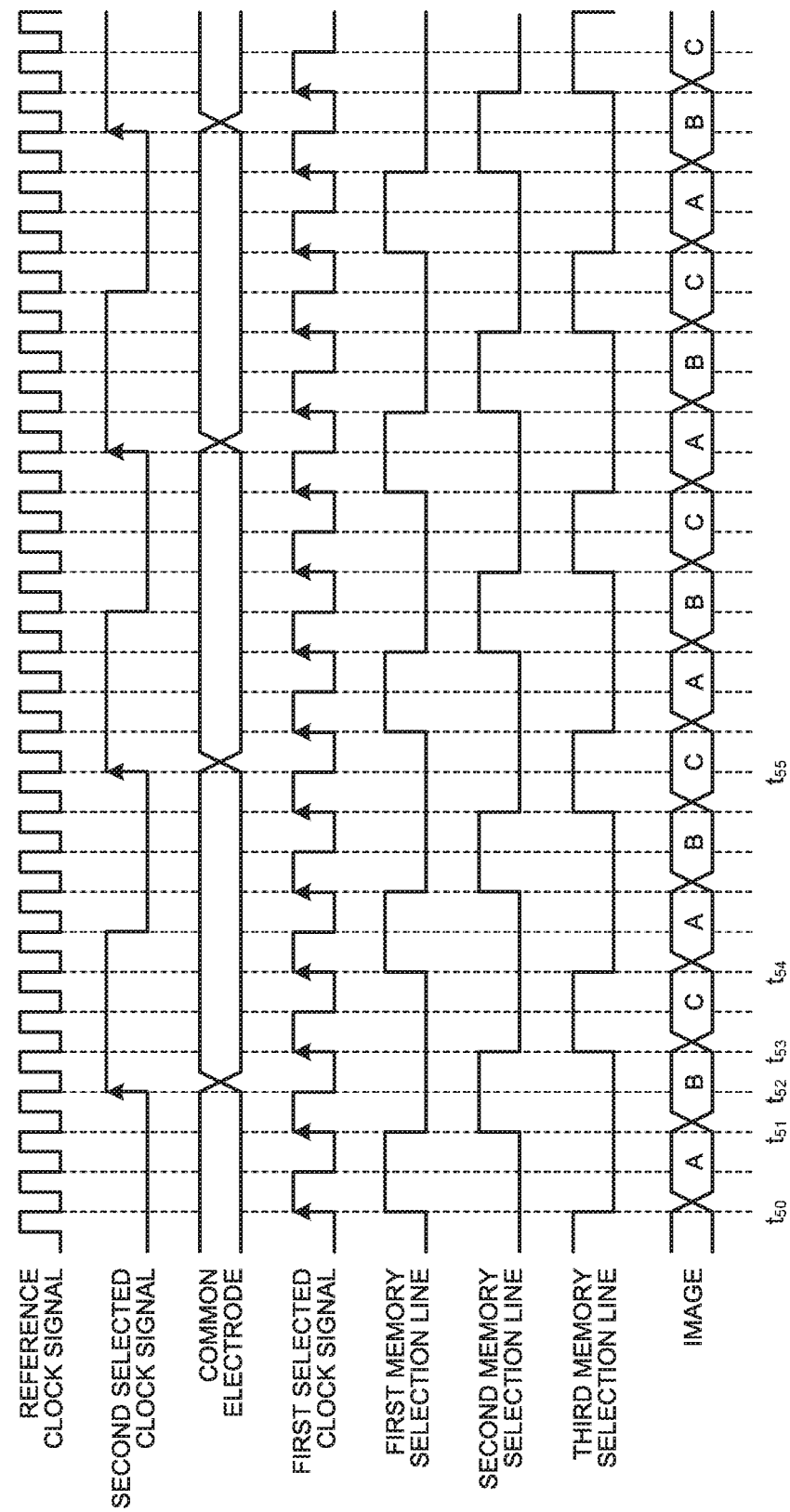
FIG. 18 is a timing chart illustrating first operation timings of the display device in the second embodiment.

FIG. 18 is a timing chart illustrating first operation timings of the display device in the second embodiment.

Throughout the entire period in FIG. 18, based on the values in the setting register 4c, the timing controller 4b outputs, to the first selector $34_1$, the control signal $Sig_6$ for selecting the second frequency-divided clock signal $CLK\text{-}X_1$. Thus, the first selector $34_1$ selects the second frequency-divided clock signal $CLK\text{-}X_1$ as the first selected clock signal $CLK\text{-}SEL_1$. The frequency of the first selected clock signal $CLK\text{-}SEL_1$ is therefore ½ of the frequency of the reference clock signal CLK. The first selector $34_1$ outputs the first selected clock signal $CLK\text{-}SEL_1$ to the memory selection circuit 8.

Based on the values in the setting register 4c, the timing controller 4b also outputs, to the second selector $34_2$, the control signal $Sig_7$ for selecting the fourth frequency-divided clock signal $CLK\text{-}X_3$. Thus, the second selector $34_2$ selects the fourth frequency-divided clock signal $CLK\text{-}X_3$ as the second selected clock signal $CLK\text{-}SEL_2$. The frequency of the second selected clock signal $CLK\text{-}SEL_2$ is therefore ⅛ of the frequency of the reference clock signal CLK. The second selector $34_2$ then outputs the second selected clock signal $CLK\text{-}SEL_2$ to the common-electrode driving circuit 6 and the inversion driving circuit 7. The common-electrode driving circuit 6 supplies, to the common electrode 23, a common potential that is switched in synchronization with the first selected clock signal $CLK\text{-}SEL_1$.

A period from a timing $t_{50}$ to a timing $t_{54}$ is an animation display (moving image display) period in which to sequentially switch an image to be displayed from one image to another among three images of "A", "B", and "C" (three frames).

At the timing $t_{50}$, the timing controller 4b outputs the control signal $Sig_2$ set to the first value to the switch $SW_2$ in the memory selection circuit 8. The switch $SW_2$ is turned on based on the control signal $Sig_2$ set to the first value and supplied from the timing controller 4b. Thus, the first selected clock signal $CLK\text{-}SEL_1$ is supplied to the latch 71.

At the timing $t_{50}$, the timing controller 4b also outputs the control signal $Sig_3$ set to the first value to the switch $SW_3$ in the memory selection circuit 8. The switch $SW_3$ electrically couples the output terminal of the latch 71 to the first memory selection lines $SEL_a$ in the respective M memory selection line groups $SL_1$, $SL_2$, . . . . Thus, the memory selection signal is supplied to each of the first memory selection lines $SEL_a$ of the respective M memory selection line groups $SL_1$, $SL_2$, . . . .

The first memories 51 coupled to the respective first memory selection lines $SEL_a$ output the sub-pixel data for displaying the image of "A" to the corresponding inversion switches 61. Thus, at the timing $t_{50}$, the display device 1A displays the image of "A".

At the timing $t_{51}$, the same operation as above is performed with respect to the second memory selection line $SEL_b$ and the image of "B". Thus, at the timing $t_{51}$, the display device 1A displays the image of "B".

At the timing $t_{52}$, the second selected clock signal $CLK\text{-}SEL_2$ changes from being low-level to being high-level. Thus, the common-electrode driving circuit 6 switches the common potential of the common electrode 23 at the timing $t_{52}$.

At the timing $t_{53}$, the same operation as above is performed with respect to the third memory selection line $SEL_c$ and the image of "C". Thus, the display device 1A displays the image of "C" at the timing $t_{53}$.

Operation that the memory selection circuit 8 performs after the timing $t_{54}$ is the same as operation that it performs for a period from the timing $t_{50}$ to the timing $t_{54}$. The description thereof is therefore omitted.

At the timing $t_{55}$, the second selected clock signal $CLK\text{-}SEL_2$ changes from being low-level to being high-level.

Thus, the common-electrode driving circuit 6 switches the common potential of the common electrode 23 at the timing $t_{55}$.

Operation that the common-electrode driving circuit 6 performs after the timing $t_{55}$ is the same as operation that it performs for a period from the timing $t_{52}$ to the timing $t_{55}$. The description thereof is therefore omitted.

As described above, during a period from the timing $t_{50}$ to the timing $t_{54}$, the display device 1A can provide animation display (moving image display) that sequentially switches an image to be displayed from one image to another among the three images of "A", "B", and "C" (three frames).

2-3. Second Operation Example

Figure 19:
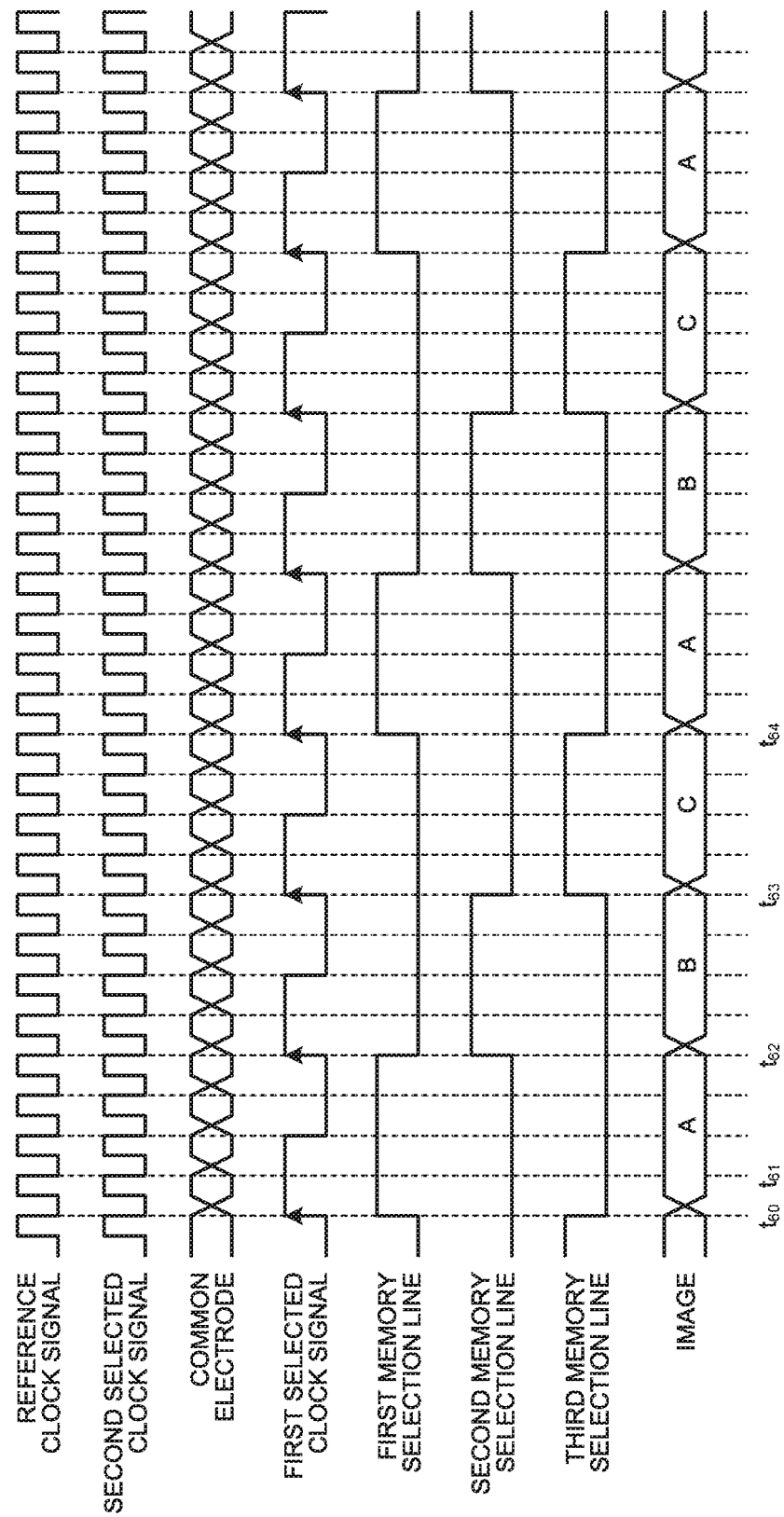
FIG. 19 is a timing chart illustrating second operation timings of the display device in the second embodiment.

FIG. 19 is a timing chart illustrating second operation timings of the display device in the second embodiment.

Throughout the entire period in FIG. 19, based on the values in the setting register 4c, the timing controller 4b outputs, to the first selector $34_1$, the control signal $Sig_6$ for selecting the third frequency-divided clock signal $CLK-X_2$. Thus, the first selector $34_1$ selects the third frequency-divided clock signal $CLK-X_2$ as the first selected clock signal $CLK-SEL_1$. The frequency of the first selected clock signal $CLK-SEL_1$ is therefore ¼ of the frequency of the reference clock signal CLK. The first selector $34_1$ outputs the first selected clock signal $CLK-SEL_1$ to the memory selection circuit 8.

Based on the values in the setting register 4c, the timing controller 4b also outputs, to the second selector $34_2$, the control signal $Sig_7$ for selecting the first frequency-divided clock signal $CLK-X_0$. Thus, the second selector $34_2$ selects the first frequency-divided clock signal $CLK-X_0$ as the second selected clock signal $CLK-SEL_2$. The frequency of the second selected clock signal $CLK-SEL_2$ therefore equals the frequency of the reference clock signal CLK. The second selector $34_2$ then outputs the second selected clock signal $CLK-SEL_2$ to the common-electrode driving circuit 6 and the inversion driving circuit 7. The common-electrode driving circuit 6 supplies, to the common electrode 23, a common potential that is switched in synchronization with the first selected clock signal $CLK-SEL_1$.

For example, the frequencies of the reference clock signal CLK and the second selected clock signal $CLK-SEL_2$ are exemplified by 1 Hz. The frequency at which the common potential of the common electrode 23 is switched is therefore 1 Hz. The frequency of the first selected clock signal $CLK-SEL_1$ is ¼ of the frequency of the reference clock signal CLK, that is, 0.25 Hz. The frequency at which frames are changed is therefore 0.25 Hz.

A period from a timing $t_{60}$ to a timing $t_{64}$ is an animation display (moving image display) period in which to sequentially switch an image to be displayed from one image to another among three images of "A", "B", and "C" (three frames).

At the timing $t_{60}$, the timing controller 4b outputs the control signal $Sig_2$ set to the first value to the switch $SW_2$ in the memory selection circuit 8. The switch $SW_2$ is turned on based on the control signal $Sig_2$ set to the first value and supplied from the timing controller 4b. Thus, the first selected clock signal $CLK-SEL_1$ is supplied to the latch 71.

At the timing $t_{60}$, the timing controller 4b also outputs the control signal $Sig_3$ set to the first value to the switch $SW_3$ in the memory selection circuit 8. The switch $SW_3$ electrically couples the output terminal of the latch 71 to the first memory selection lines $SEL_a$ in the respective M memory selection line groups $SL_1$, $SL_2$, . . . . Thus, the memory selection signal is supplied to each of the first memory selection lines $SEL_a$ of the respective M memory selection line groups $SL_1$, $SL_2$, . . . .

The first memories 51 coupled to the respective first memory selection lines $SEL_a$ output the sub-pixel data for displaying the image of "A" to the corresponding inversion switches 61. Thus, at the timing $t_{60}$, the display device 1A displays the image of "A".

At the timing $t_{60}$, the second selected clock signal $CLK-SEL_2$ changes from being high-level to being low-level. Thus, the common-electrode driving circuit 6 switches the common potential of the common electrode 23 at the timing $t_{60}$.

At the timing $t_{61}$, the second selected clock signal $CLK-SEL_2$ changes from being high-level to being low-level. Thus, the common-electrode driving circuit 6 switches the common potential of the common electrode 23 at the timing $t_{61}$.

Operation that the common-electrode driving circuit 6 performs after the timing $t_{61}$ is the same as operation that it performs for a period from the timing $t_{60}$ to the timing $t_{61}$. The description thereof is therefore omitted.

At the timing $t_{62}$, the same operation as above is performed with respect to the second memory selection line $SEL_b$ and the image of "B". Thus, the display device 1A displays the image of "B" at the timing $t_{62}$.

At the timing $t_{63}$, the same operation as above is performed with respect to the third memory selection line $SEL_c$ and the image of "C". Thus, the display device 1A displays the image of "C" at the timing $t_{63}$.

Operation that the memory selection circuit 8 performs after the timing $t_{64}$ is the same as operation that it performs for a period from the timing $t_{60}$ to the timing $t_{64}$. The description thereof is therefore omitted.

As described above, during a period from the timing $t_{60}$ to the timing $t_{64}$, the display device 1A can provide animation display (moving image display) that sequentially switches an image to be displayed from one image to another among the three images of "A", "B", and "C" (three frames).

The display device 1A in the second embodiment is configured such that, based on the control signal $Sig_6$, the first selector $34_1$ selects one of the first frequency-divided clock signal $CLK-X_0$ to the fifth frequency-divided clock signal $CLK-X_4$ as the first selected clock signal $CLK-SEL_1$ and outputs the first selected clock signal $CLK-SEL_1$ to the memory selection circuit 8. Thus, the display device 1A is capable of causing the frequency at which images (frames) are switched to be changed without changing the frequency of the reference clock signal CLK supplied from the outside.

The display device 1A in the second embodiment is configured such that, based on the control signal $Sig_7$, the second selector $34_2$ selects one of the first frequency-divided clock signal $CLK-X_0$ to the fifth frequency-divided clock signal $CLK-X_4$ as the second selected clock signal $CLK-SEL_2$ and outputs the second selected clock signal $CLK-SEL_2$ to the common-electrode driving circuit 6 and the inversion driving circuit 7. Thus, the display device 1A is capable of causing the frequency at which the common potential of the common electrode 23 is switched to be changed without changing the frequency of the reference clock signal CLK supplied from the outside.

Thus, the display device 1A is capable of causing the frequency at which frames are switched and the frequency at which the potential of the common electrode 23 is inverted to be different from each other in accordance with the manner in which the display device is used and without changing the frequency of the reference clock signal CLK.

The display device 1A is therefore capable of causing the frequency at which frames are switched and the frequency at which the polarity of the common electrode 23 is inverted (at which the potential of the common electrode 23 is switched) to be different from each other in accordance with the manner in which the display device 1A is used.

Continuous application of voltage to a liquid crystal element in the same direction deteriorates the liquid crystal element, resulting in screen burn-in of a liquid crystal display device. The common inversion driving is implemented for preventing such screen burn-in of a liquid crystal display device. When the sub-pixels SPix provides multiple-gradation display of 6 bits, 8 bits, 10 bits, or the like, the deterioration of the liquid crystal element greatly affects the visual perception of an observer. Therefore, the frequency at which the polarity of the common electrode is inverted needs to be increased.

In contrast, the deterioration of the liquid crystal element insignificantly affects the visual perception of an observer when the sub-pixels SPix provide one-bit binary display, as in the case with a reflective liquid crystal display device for use in an electronic shelf label. Therefore, the frequency at which the polarity of the common electrode is inverted may be low.

The display device 1A in the second embodiment is capable of causing the frequency at which the polarity of the common electrode 23 is inverted to be changed in accordance with the manner in which the display device 1A is used.

The display device 1A in the second embodiment is capable of causing the frequency at which frames are switched and the frequency at which the potential of the common potential of the common electrode 23 is switched to be changed based on the values in the setting register 4c. The display device 1A is capable of, even when a frame is being displayed, causing the frequency at which frames are switched and the frequency at which the polarity of the common electrode 23 is inverted to be changed by having the values in the setting register 4c updated from an external circuit. The display device 1A is therefore capable of, in accordance with the manner in which the display device 1A is used, dynamically changing the frequency at which frames are switched and the frequency at which the polarity of the common electrode 23 is inverted.

3. Third Embodiment

Figure 20:
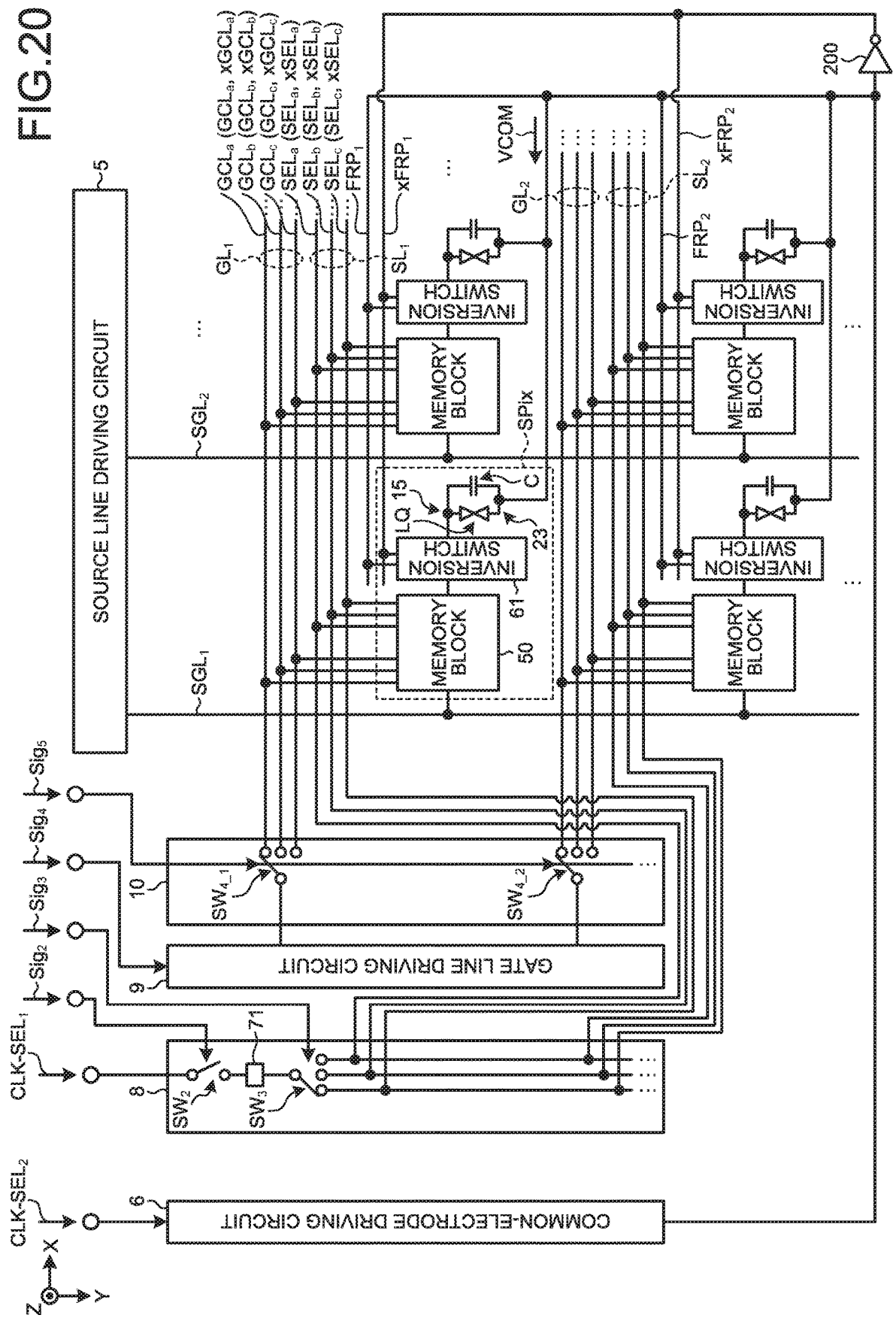
FIG. 20 illustrates a circuit configuration of a display device in a third embodiment.

FIG. 20 illustrates a circuit configuration of a display device in a third embodiment.

The display device in the third embodiment is different from the display device in the second embodiment (see FIG. 17) in that it does not include the inversion driving circuit 7.

A display signal (non-inverted display signal) that varies in synchronization and in phase with the common potential supplied to the common electrode 23 is supplied to the first display signal line FRP from the common-electrode driving circuit 6. The common potential supplied to the common electrode 23 is supplied to an inverter 200. An inverted display signal that varies in synchronization and in opposite phase with the common potential supplied to the common electrode 23 is supplied to the second display signal line xFRP from the inverter 200.

Figure 21:
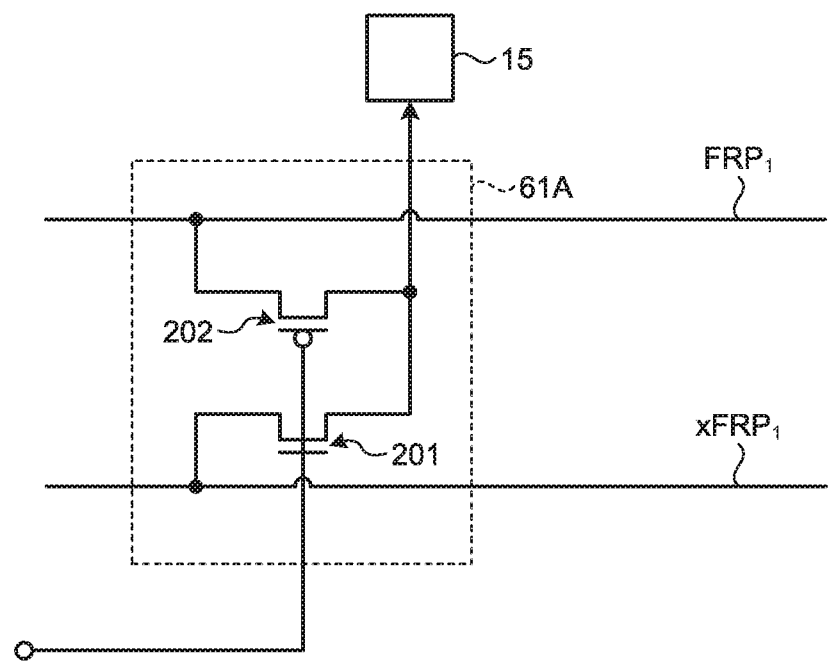
FIG. 21 illustrates a circuit configuration of an inversion switch in a sub-pixel of the display device in the third embodiment.

FIG. 21 illustrates a circuit configuration of an inversion switch 61A in the sub-pixel of the display device in the third embodiment. The inversion switch 61A includes an N-channel transistor 201 and a P-channel transistor 202.

The gate terminal of the N-channel transistor 201 and the gate terminal of the P-channel transistor 202 are supplied with the sub-pixel data from the first memory 51, the second memory 52, or the third memory 53.

One of the source and the drain of the N-channel transistor 201 is electrically coupled to the second display signal line $xFRP_1$. The other one of the source and the drain of the N-channel transistor 201 is electrically coupled to the sub-pixel electrode 15.

One of the source and the drain of the P-channel transistor 202 is electrically coupled to the first display signal line $FRP_1$. The other one of the source and the drain of the P-channel transistor 202 is electrically coupled to the sub-pixel electrode 15.

When the sub-pixel data supplied from the first memory 51, the second memory 52, or the third memory 53 is high-level, the N-channel transistor 201 is on and the P-channel transistor 202 is off. Therefore, the inverted display signal supplied to the second display signal line $xFRP_1$ is supplied to the sub-pixel electrode 15 via the N-channel transistor 201.

An inverted display signal supplied to the second display signal line $xFRP_1$ varies in synchronization and in opposite phase with the common potential supplied to the common electrode 23. If the inverted display signal and the common potential are out of phase with each other, voltage is applied to the liquid crystal LQ, and molecules change in orientation as compared with their initial orientation state. Thus, the sub-pixel SPix displays white (enters a state transmitting the reflected light, that is, a state displaying colors with the color filter transmitting the reflected light). Thus, the display device 1A can implement a common inversion driving method.

When the sub-pixel data supplied from the first memory 51, the second memory 52, or the third memory 53 is low-level, the N-channel transistor 201 is off and the P-channel transistor 202 is on. Therefore, the display signal supplied to the first display signal line $FRP_1$ is supplied to the sub-pixel electrode 15 via the P-channel transistor 202.

A display signal supplied to the first display signal line $FRP_1$ varies in synchronization and in phase with the common potential supplied to the common electrode 23. If the display signal and the common potential are in phase with each other, no voltage is applied to the liquid crystal LQ, and liquid crystal molecules do not change in orientation as compared with their initial orientation state. Thus, the sub-pixel SPix displays black (enters a state not transmitting the reflected light, that is, a state not displaying colors with the color filter not transmitting the reflected light). Thus, the display device 1A can implement a common inversion driving method. Described above is what is called a normally-black configuration such that light is not transmitted with liquid crystal molecules being in their initial orientation state. This is not a limiting example, and it is possible to alternatively employ what is called a normally-white configuration such that, while light is transmitted with liquid crystal molecules in their initial orientation state, black is displayed with the liquid crystal molecules being in an orientation state changed from their initial orientation state by the application of voltage.

Figure 22:
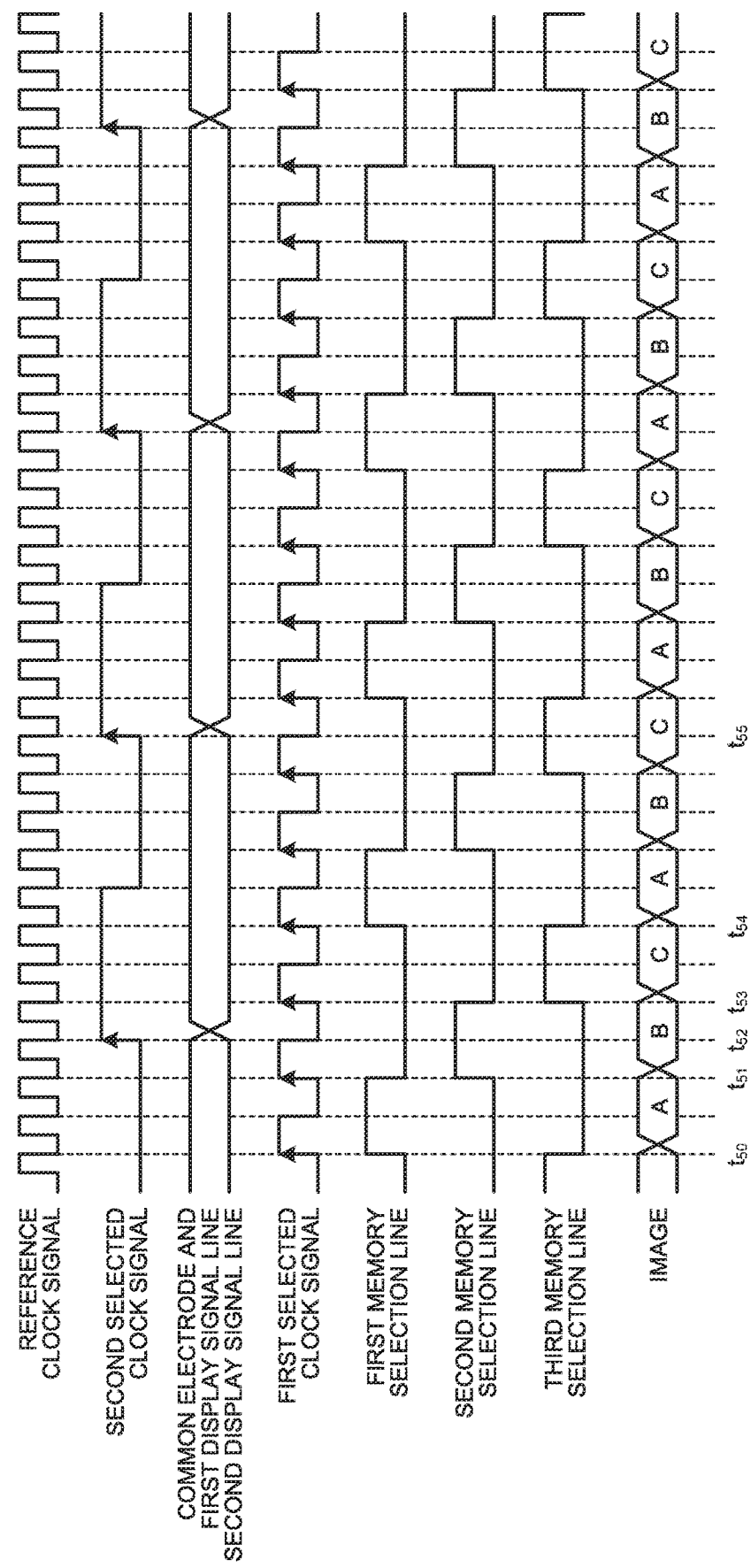
FIG. 22 is a timing chart illustrating operation timings of the display device in the third embodiment.

FIG. 22 is a timing chart illustrating operation timings of the display device in the third embodiment. As illustrated in FIG. 22, a display signal supplied to the first display signal line FRP varies in synchronization and in phase with the common potential supplied to the common electrode 23. An inverted display signal supplied to the second display signal line xFRP varies in synchronization and in opposite phase with the common potential supplied to the common electrode 23. The operation timings other than the aforementioned timings are the same as those of the display device in the second embodiment (see FIG. 18 and FIG. 19). Further description is therefore omitted.

The display device in the third embodiment operates in the same manner as the display device in the second embodiment, thus having the same advantage as the display device in the second embodiment. Because the first display signal line FRP and the second display signal line xFRP are coupled to wiring that supplies a common potential to a common electrode, the signals supplied to the first display signal line FRP and the second display signal line xFRP can be changed when the common potential changes in accordance with the second selected clock signal CLK-SEL$_2$. Consequently, a circuit can have a smaller size and an improved synchronization characteristic.

4. Application Example of First to Third Embodiments

Figure 23:
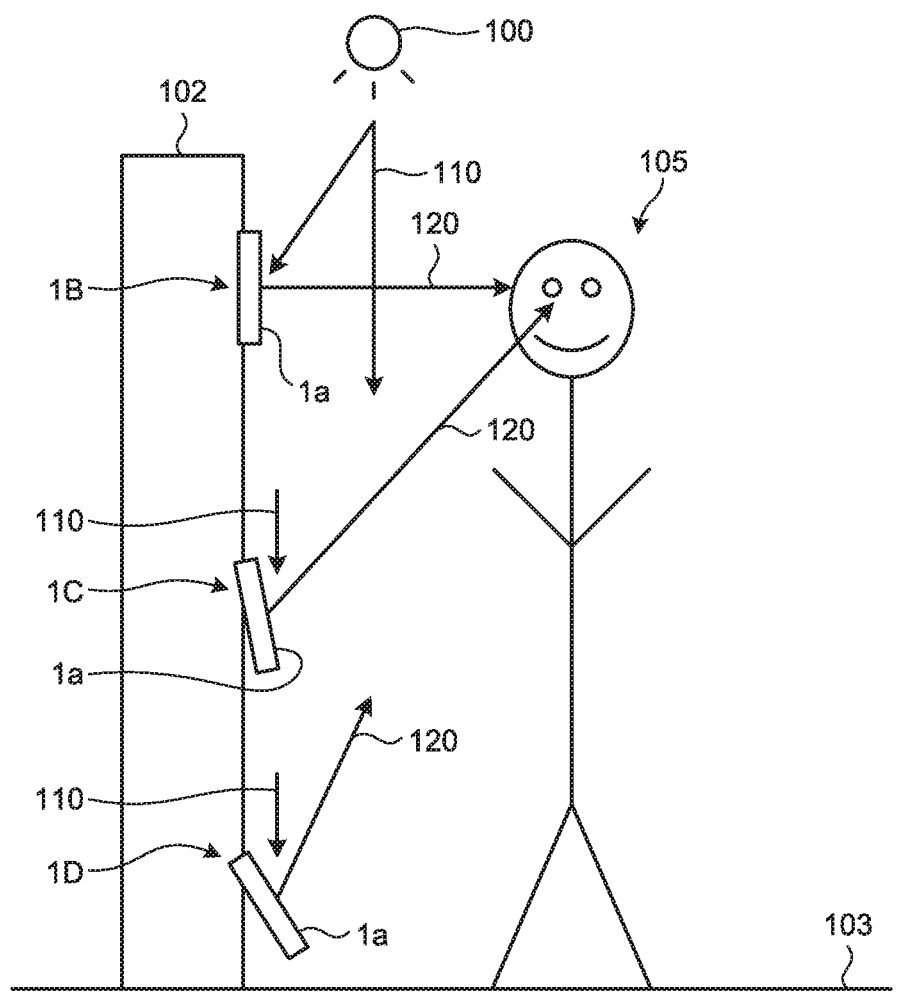
FIG. 23 illustrates an application example of the display device in any one of the first to the third embodiments.

FIG. 23 illustrates an application example of the display device in any one of the first to the third embodiments. FIG. 23 illustrates an example in which the display device 1 or 1A is applied to an electronic shelf label.

As illustrated in FIG. 23, display devices 1B, 1C, and 1D are individually attached to a shelf 102. Each of the display devices 1B, 1C, and 1D has the same configuration as the above described display device 1 or 1A. The display devices 1B, 1C, and 1D are installed at different heights from a floor surface 103 and with different panel tilt angles. The panel tilt angles are formed by the normal lines of display surfaces 1a and the horizontal direction. The display devices 1B, 1C, and 1D reflect light 110 incident thereon from lighting equipment 100 as a light source, thereby causing images 120 to emanate toward an observer 105.

While preferred embodiments of the present invention have been described heretofore, these embodiments are not intended to limit the present disclosure. Descriptions disclosed in these embodiments are merely illustrative, and can be modified variously without departing from the spirit of the present invention. Modifications made without departing from the spirit of the present invention naturally fall within the technical scope of the present invention. At least any of omission, replacement, and modification can be made in various manners to any constituent element in the above described embodiment and each of the modifications without departing from the spirit of the present invention.

What is claimed is:

1. A display device comprising:
   a plurality of sub-pixels arranged in a row direction and a column direction and each including a first switch circuit, a sub-pixel electrode, and a memory block that includes a plurality of memories each of which is configured to store therein sub-pixel data;
   a clock signal output circuit configured to, based on a reference clock signal, output a plurality of clock signals having different frequencies;
   a selection circuit configured to select one of the clock signals as a selected clock signal;
   a plurality of memory selection line groups provided for respective rows and each including a plurality of memory selection lines electrically coupled to the memory blocks in the respective sub-pixels that belong to the corresponding row;
   a memory selection circuit configured to output a memory selection signal concurrently to the memory selection line groups in synchronization with the selected clock signal, the memory selection signal being a signal for selecting one from the memories in each of the memory blocks;
   a common electrode to which a common potential common to the sub-pixels is supplied; and
   a common-electrode driving circuit configured to switch the common potential in synchronization with the reference clock signal and output the switched common potential,
   wherein the first switch circuit of each of the sub-pixels is configured to select one of the memories of the memory block corresponding to the memory selection line that has been supplied with the memory selection signal, and
   wherein the sub-pixel electrode is driven based on the sub-pixel data stored in the selected one of the memories to display an image.

2. The display device according to claim 1,
   wherein each of the sub-pixels further includes
      a second switch circuit configured to output a selected display signal to the sub-pixel electrode based on the sub-pixel data received from the memory block via the first switch circuit,
   wherein the display device further comprises:
      a plurality of display signal lines provided corresponding to the rows and each of which is electrically coupled to the corresponding second switch circuits; and
      an inversion driving circuit configured to generate a plurality of display signals including a non-inverted display signal and an inverted display signal obtained by inverting the non-inverted display signal in synchronization with the reference clock signal and output the generated display signals to the display signal lines, and
   wherein each of the second switch circuits is configured to output one of the generated display signals as the selected display signal to the sub-pixel electrode based on the sub-pixel data.

3. The display device according to claim 1,
   wherein the clock signal output circuit outputs, to the selection circuit, the clock signals obtained by dividing the frequency of the reference clock signal by a plurality of division factors.

4. The display device according to claim 1,
   wherein the memory selection circuit sequentially switches a destination to which the memory selection signal is to be output, from one memory to another among the memory selection lines in each of the memory selection line groups, and
   wherein, in accordance with the sequential switching of the destination to which the memory selection signal is to be output, the sub-pixels display an image based on the sub-pixel data stored in the memories.

5. The display device according to claim 1, further comprising:
   a plurality of gate line groups provided for the respective rows and each including a plurality of gate lines electrically coupled to the memory blocks in the respective sub-pixels that belong to the corresponding row;
   a gate line driving circuit configured to sequentially output a gate signal to the rows in writing the sub-pixel data into the memory blocks, the gate signal being a signal for selecting one of the rows;
   a plurality of source lines provided for respective columns;

a source line driving circuit configured to output a plurality of pieces of the sub-pixel data to the respective source lines in writing the sub-pixel data into the memory blocks; and a gate line selection circuit configured to electrically couple one of the gate lines in each of the gate line groups to the gate line driving circuit in writing the sub-pixel data into the memory blocks, wherein each of the sub-pixels further includes a third switch circuit, and wherein the third switch circuit of each of the sub-pixels in one of the rows that has the gate signal supplied thereto causes the sub-pixel data supplied to the corresponding source line to be stored in one of the memories therein in accordance with the gate line that has been supplied with the gate signal.

6. The display device according to claim 5, wherein, in each of the sub-pixels, the sub-pixel electrode is driven based on the sub-pixel data stored in a first memory of the sub-pixel, in accordance with the memory selection line that has been supplied with the memory selection signal, and at the same time, the third switch circuit stores the sub-pixel data that has been supplied to the corresponding source line in a second memory of the sub-pixel, in accordance with the gate line that has been supplied with the gate signal, and wherein the first memory is one of the memories of the sub-pixel, and the second memory is different from the first memory.

7. A display device comprising:

a plurality of sub-pixels arranged in a row direction and a column direction and each including a first switch circuit, a sub-pixel electrode, and a memory block that includes a plurality of memories each of which is configured to store therein sub-pixel data;

a clock signal output circuit configured to, based on a reference clock signal, output a plurality of clock signals having different frequencies;

a selection circuit configured to select one of the clock signals as a first selected clock signal and select one of the clock signals as a second selected clock signal;

a plurality of memory selection line groups provided for respective rows and each including a plurality of memory selection lines electrically coupled to the memory blocks in the respective sub-pixels that belong to the corresponding row;

a memory selection circuit configured to output a memory selection signal concurrently to the memory selection line groups in synchronization with the first selected clock signal, the memory selection signal being a signal for selecting one from the memories in each of the memory blocks;

a common electrode to which a common potential common to the sub-pixels is supplied; and a common-electrode driving circuit configured to switch the common potential in synchronization with the second selected clock signal and output the switched common potential, wherein the first switch circuit of each of the sub-pixels is configured to select one of the memories of the memory block corresponding to the memory selection line that has been supplied with the memory selection signal, and wherein the sub-pixel electrode is driven based on the sub-pixel data stored in the selected one of the memories to display an image.

8. The display device according to claim 7, wherein wherein each of the sub-pixels further includes a second switch circuit configured to output a selected display signal to the sub-pixel electrode based on the sub-pixel data received from the memory block via the first switch circuit, wherein the display device further comprises:

a plurality of display signal lines provided for the rows and each of which is electrically coupled to the corresponding second switch circuits; and an inversion driving circuit configured to generate a plurality of display signals including a non-inverted display signal and an inverted display signal obtained by inverting the non-inverted display signal in synchronization with the second selected clock signal and output the generated display signals to the display signal lines, and wherein each of the second switch circuit is configured to output one of the generated display signals as the selected display signal to the sub-pixel electrode based on the sub-pixel data.

9. The display device according to claim 7, wherein the clock signal output circuit outputs, to the selection circuit, the clock signals obtained by dividing the frequency of the reference clock signal by a plurality of division factors.

10. The display device according to claim 7, wherein the memory selection circuit sequentially switches a destination to which the memory selection signal is to be output, from one memory to another among the memory selection lines in each of the memory selection line groups, and wherein, in accordance with the sequential switching of the destination to which the memory selection signal is to be output, the sub-pixels display an image based on the sub-pixel data stored in the memories.

11. The display device according to claim 7, further comprising:

a plurality of gate line groups provided for the respective rows and each including a plurality of gate lines electrically coupled to the memory blocks in the respective sub-pixels that belong to the corresponding row;

a gate line driving circuit configured to sequentially output a gate signal to the rows in writing the sub-pixel data into the memory blocks, the gate signal being a signal for selecting one of the rows;

a plurality of source lines provided for respective columns;

a source line driving circuit configured to output a plurality of pieces of the sub-pixel data to the respective source lines in writing the sub-pixel data into the memory blocks; and a gate line selection circuit configured to electrically couple one of the gate lines in each of the gate line groups to the gate line driving circuit in writing the sub-pixel data into the memory blocks, wherein each of the sub-pixels further includes a third switch circuit, and wherein the third switch circuit of each of the sub-pixels in one of the rows that has the gate signal supplied thereto causes the sub-pixel data supplied to the corresponding source line to be stored in one of the memories therein in accordance with the gate line that has been supplied with the gate signal.

12. The display device according to claim 11, wherein, in each of the sub-pixels, the sub-pixel electrode is driven based on the sub-pixel data stored in a first memory of the sub-pixel, in accordance with the memory selection line that has been supplied with the memory selection signal, and at the same time, the third switch circuit stores the sub-pixel data that has been supplied to the corresponding source line in a second memory of the sub-pixel, in accordance with the gate line that has been supplied with the gate signal, and wherein the first memory is one of the memories of the sub-pixel, and the second memory is different from the first memory.

* * * * *